(12) United States Patent
Sonoda et al.

(10) Patent No.: US 11,069,877 B2
(45) Date of Patent: Jul. 20, 2021

(54) DISPLAY APPARATUS AND METHOD FOR MANUFACTURING SAME

(71) Applicant: Sharp Kabushiki Kaisha, Sakai (JP)

(72) Inventors: Tohru Sonoda, Sakai (JP); Takeshi Hirase, Sakai (JP); Hisao Ochi, Sakai (JP); Takashi Ochi, Sakai (JP); Tohru Senoo, Sakai (JP); Akihiro Matsui, Sakai (JP); Jumpei Takahashi, Sakai (JP); Yoshinobu Miyamoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/489,712

(22) PCT Filed: Mar. 3, 2017

(86) PCT No.: PCT/JP2017/008598
§ 371 (c)(1),
(2) Date: Aug. 29, 2019

(87) PCT Pub. No.: WO2018/158953
PCT Pub. Date: Sep. 7, 2018

(65) Prior Publication Data
US 2020/0006702 A1 Jan. 2, 2020

(51) Int. Cl.
*H01L 51/52* (2006.01)
*H01L 27/32* (2006.01)
*H01L 51/56* (2006.01)

(52) U.S. Cl.
CPC ...... *H01L 51/5253* (2013.01); *H01L 27/3246* (2013.01); *H01L 51/56* (2013.01); *H01L 2251/566* (2013.01)

(58) Field of Classification Search
CPC . H01L 51/5253; H01L 27/3246; H01L 51/56; H01L 2251/566; H01L 27/3248;
(Continued)

(56) References Cited

U.S. PATENT DOCUMENTS

2004/0137142 A1 7/2004 Nishikawa
2005/0231107 A1* 10/2005 Yamazaki ............. H01L 51/524
313/506
(Continued)

FOREIGN PATENT DOCUMENTS

JP 2004-165068 A 6/2004
JP 2005-327708 A 11/2005
(Continued)

OTHER PUBLICATIONS

Official Communication issued in International Patent Application No. PCT/JP2017/008598, dated May 30, 2017.

*Primary Examiner* — Yasser A Abdelaziez
(74) *Attorney, Agent, or Firm* — Keating & Bennett, LLP

(57) ABSTRACT

An organic EL display device is provided with an eaves body that includes a protruding portion outside a display region on a TFT substrate, along an edge portion on which a first inorganic layer and a second inorganic layer of a sealing film are provided. The first inorganic layer and the second inorganic layer cover the protruding portion and are split apart below the protruding portion facing a wall surface of the eaves body.

15 Claims, 12 Drawing Sheets

(58) Field of Classification Search
CPC . H01L 27/3211; H01L 27/3223; H05B 33/04; H05B 33/06; H05B 33/10; H05B 33/12; H05B 33/22; G09F 9/30
See application file for complete search history.

(56) References Cited

U.S. PATENT DOCUMENTS

| | | | |
|---|---|---|---|
| 2007/0273271 A1* | 11/2007 | Yamazaki | H01L 51/5253 |
| | | | 313/504 |
| 2009/0273589 A1 | 11/2009 | Asano et al. | |
| 2010/0151211 A1 | 6/2010 | Kodaira et al. | |
| 2014/0131683 A1 | 5/2014 | Kim et al. | |
| 2015/0048329 A1 | 2/2015 | Kim | |
| 2015/0084023 A1* | 3/2015 | Sato | H01L 27/3276 |
| | | | 257/40 |
| 2015/0357594 A1 | 12/2015 | Osaki et al. | |
| 2017/0005293 A1 | 1/2017 | Kim et al. | |
| 2018/0090722 A1* | 3/2018 | Kim | H01L 51/0096 |
| 2019/0363145 A1* | 11/2019 | Ohta | H05B 33/06 |
| 2019/0369788 A1* | 12/2019 | Tada | H01L 27/3258 |

FOREIGN PATENT DOCUMENTS

| | | |
|---|---|---|
| JP | 2007-294403 A | 11/2007 |
| JP | 2010-141181 A | 6/2010 |
| JP | 2014-127436 A | 7/2014 |
| WO | 2007/088690 A1 | 8/2007 |

* cited by examiner

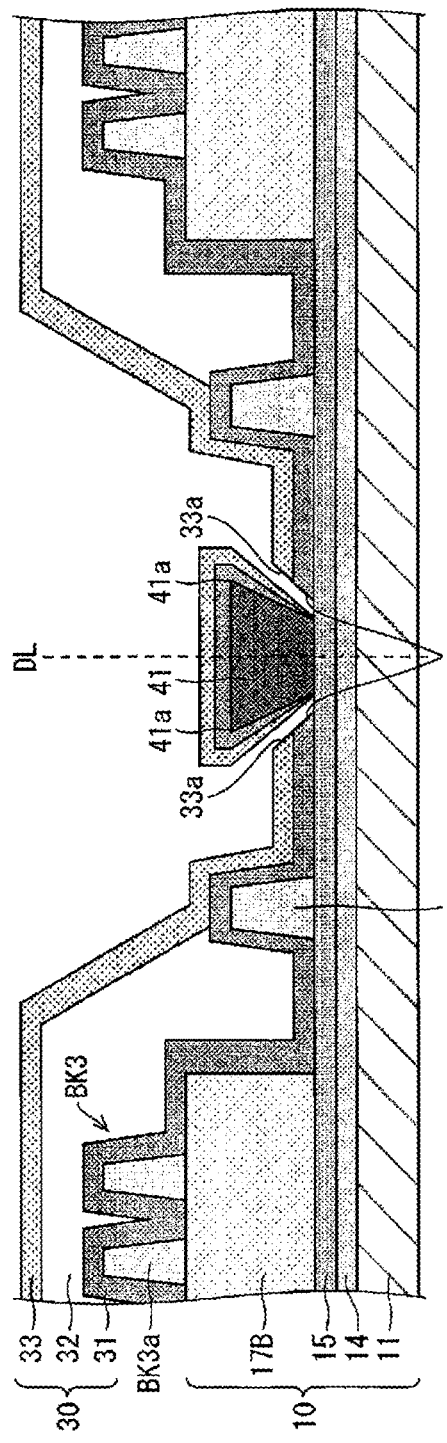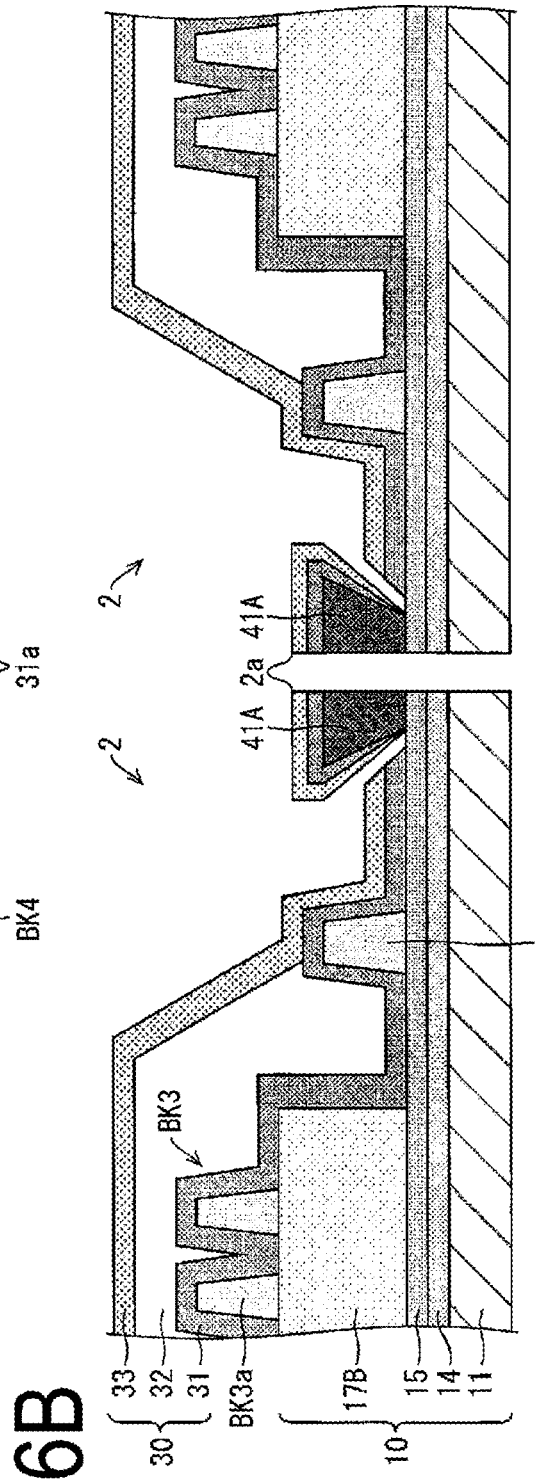

DISPLAY APPARATUS AND METHOD FOR MANUFACTURING SAME

TECHNICAL FIELD

The disclosure relates to a display device and to a method for manufacturing the display device.

BACKGROUND ART

An EL display device that uses Electro Luminescence (hereinafter referred to as "EL") of a luminescent material is gathering attention as a display device offering a faster response speed in comparison to a liquid crystal display device, and also having a wider viewing angle.

This type of display device has a configuration in which light emitting elements, such as OLED elements, connected to thin film transistors (TFTs) are provided on a TFT substrate having a configuration in which the TFTs are provided on a support body such as a glass substrate or the like.

However, in general, this type of light emitting element is susceptible to the influence of moisture, oxygen, and the like, and the characteristics thereof deteriorate due to a reaction to small amounts of moisture, oxygen, or the like, thus impairing the life of the display device.

Thus, to prevent moisture or oxygen from penetrating into the light emitting element, the light emitting element is sealed with a sealing film including an inorganic layer. The inorganic layer has a moisture-proof function to prevent the penetration of moisture and functions as a barrier layer.

In commercial production, after a plurality of display devices are formed on a large mother substrate, individual display devices are obtained from the plurality of display devices by dividing the substrate along boundaries between the display devices adjacent to each other.

However, in a case that the substrate is divided in this way, and the inorganic layer of the sealing film is present on a division line, a crack generated by cutting the inorganic layer at the time of dividing the mother substrate may spread through the inorganic layer due to impact, vibrations, or the like, and may spread to a display region of the divided display device, when or after dividing the mother substrate.

In a case that the crack generated by dividing the mother substrate reaches into the display region of the display device in this manner, moisture or oxygen penetrates into the light emitting element, and the light emitting element is damaged, for example, thus reducing the reliability of the display device. Therefore, to prevent the crack generated by dividing of the mother substrate in the related art, regions to be divided and regions on which the inorganic layer is formed need to be separated (see PTLs 1 and 2, for example).

CITATION LIST

Patent Literature

PTL 1: JP 2010-141181 A (published on Jun. 24, 2010)
PTL 2: JP 2014-127436 A (published on Jul. 7, 2014)

SUMMARY

Technical Problem

However, in a case that each sealing film is formed independently so that adjacent sealing films are not in contact with each other, and the inorganic layer is formed using a CVD mask, there is a problem in that a shadow is generated on an edge portion of the inorganic layer and the film thickness becomes thinner. Therefore, the edge portion of the inorganic layer needs to be sufficiently separated from the display region by a distance including machining accuracy and alignment accuracy of the CVD mask such that the shadow does not reach the display region. As a result, there is a problem in that frame narrowing becomes difficult, for example.

In light of the foregoing, an object of the disclosure is to provide a highly reliable display device in which a sealing film is formed on an edge portion of the display device and which can prevent a crack generated in the sealing film as a result of division of a mother substrate from spreading into a display region, and a method for manufacturing the display device.

Solution to Problem

To solve the above-described problems, a display device according to an aspect of the disclosure includes a support body, a plurality of light emitting elements provided on the support body, and a sealing film configured to seal the plurality of light emitting elements. The sealing film includes at least an inorganic layer, and the inorganic layer covers at least part of an edge portion of the support body in a plan view. An eaves body including an eaves portion is provided outside a display region of the support body in which the plurality of light emitting elements are disposed and provided along the edge portion on which the inorganic layer is provided in a plan view. The eaves portion is provided protruding above the support body in a cross-sectional view, on at least one of edge portions of the eaves body along the edge portion of the support body, and the inorganic layer covers the eaves portion and is split apart below the eaves portion facing a wall surface of the eaves body.

To solve the above-described problems, a method for manufacturing a display device according to an aspect of the disclosure is a method for manufacturing a display device including a support body, a plurality of light emitting elements provided on the support body, and a sealing film configured to seal the plurality of light emitting elements. The method includes forming the plurality of light emitting elements on a mother substrate configuring at least part of the support body such that a plurality of display regions, on which the plurality of light emitting elements are disposed, are formed corresponding to each display device, forming an eaves body including an eaves portion along a scheduled division line on which the mother substrate is divided and singulated into individual display devices in a plan view, the eaves portion being provided on at least one edge portion of edge portions along the scheduled division line and protruding in an in-plan direction above the support body in a cross-sectional view, forming the sealing film, and dividing the mother substrate, on which the sealing film is formed, along the scheduled division line around each of the plurality of display regions. The forming the sealing film includes forming an inorganic layer. In the forming an inorganic layer, the inorganic layer is formed such that the inorganic layer covers the eaves portion and covers the scheduled division line along the edge portion of the eaves body in a plan view, and the inorganic layer is split apart below the eaves portion facing a wall surface of the eaves body.

Advantageous Effects of Disclosure

According to an aspect of the disclosure, a highly reliable display device in which a sealing film is formed on an edge portion of the display device and which can prevent a crack generated in the sealing film as a result of division of a mother substrate from spreading into a display region, and a method for manufacturing the display device can be provided.

BRIEF DESCRIPTION OF DRAWINGS

FIGS. 6A and 6B are cross-sectional views illustrating manufacturing steps of main portions of an organic EL display device according to a first modified example of the first embodiment of the disclosure in order of the steps.

DESCRIPTION OF EMBODIMENTS

A detailed description follows regarding embodiments of the disclosure.

First Embodiment

A description follows regarding an embodiment of the disclosure with reference to FIG. 1 to FIGS. 7A and 7B.

Note that, in the following description, as an example of a display device according to the present embodiment, an example is given of an organic EL display device provided with an Organic Light Emitting Diode (OLED) layer including OLED elements, known as organic EL elements, as light emitting elements.

Schematic Configuration of Organic EL Display Device

Figure 1:
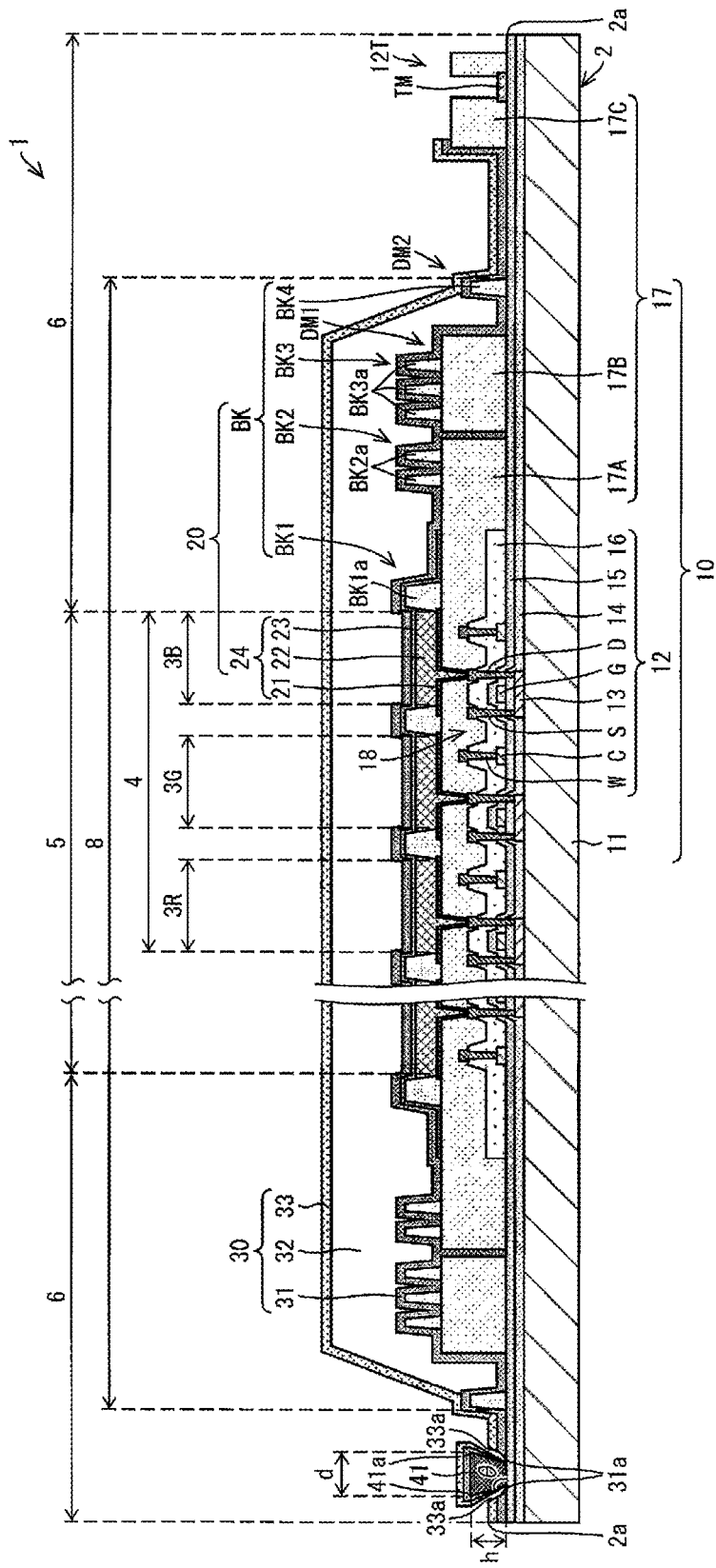
FIG. 1 is a cross-sectional view illustrating an example of a schematic configuration of an organic EL display device according to a first embodiment of the disclosure.
Figure 2:
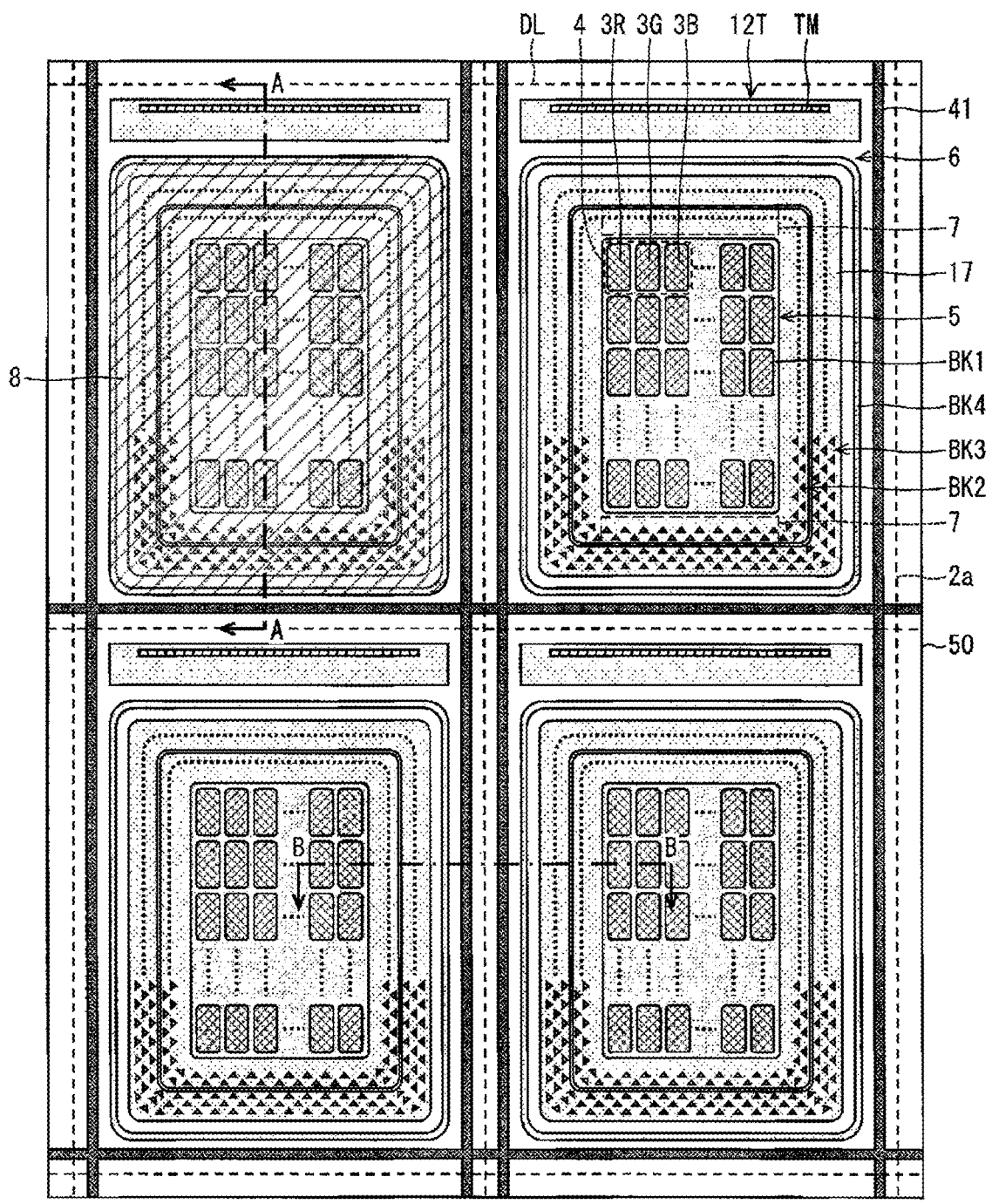
FIG. 2 is a plan view illustrating a schematic configuration of main portions of an organic EL substrate of an organic EL display device according to the first embodiment of the disclosure before performing singulation.

FIG. 1 is a cross sectional view illustrating an example of a schematic configuration of an organic EL display device 1 according to the present embodiment. FIG. 2 is a plan view illustrating a schematic configuration of main portions of an organic EL substrate 2 of the organic EL display device 1 according to the present embodiment, before performing singulation. Note that FIG. 1 illustrates a cross section of the organic EL display device 1 after the singulation, and the cross section corresponds to a cross section of the organic EL display device 1 illustrated in FIG. 2 taken along a line A-A in the direction of the arrows.

Note that in FIG. 2, for ease of illustration, illustration of portions is omitted apart from banks BK1 to BK4, an eaves body 41, and a terminal portion 12T on which a plurality of terminals TM serving as terminals for the respective wiring lines are provided. Furthermore, in FIG. 2, for ease of illustration, a ratio of a frame region 6 with respect to a display region 5 is illustrated as being larger than in actuality.

As illustrated in FIG. 1, the organic EL display device 1 is provided with the organic EL substrate 2 and a drive circuit (not illustrated).

The organic EL substrate 2 has a configuration in which an OLED layer 20 configuring OLED elements (organic EL elements) and the eaves body 41, a sealing film 30, and a cover body (not illustrated) are provided on a Thin Film Transistor (TFT) substrate 10, in this order from the TFT substrate 10 side.

Note that the organic EL display device 1 may be a flexible display device that has flexibility and can be bent, or may be a non-bendable display device that has rigidity.

TFT Substrate 10

The TFT substrate 10 is provided with an electrically insulating support body 11 and a TFT layer 12 provided on the support body 11.

Support Body 11

Examples of the support body 11 include a glass substrate, a plastic substrate, or a plastic film. Note that the support body 11 may be a flexible layered film in which a barrier layer (a moisture-proof layer) is provided on a plastic film (a resin layer). Furthermore, the layered film may have a configuration in which, on a face opposite to the face of the plastic film on which the barrier layer is provided, a lower face film that faces the outside is provided, with an adhesive layer interposed therebetween.

Examples of resin used for the plastic film (the resin layer) include a polyimide, polyethylene, or a polyamide.

The barrier layer is a layer for preventing moisture or impurities from reaching the TFT layer 12 and the OLED layer 20 formed on the support body 11, and can be formed, for example, by a silicon oxide (SiOx) film, a silicon nitride (SiNx) film, or a layered film of these, formed by CVD.

The barrier layer is provided over the whole surface of the plastic film, such that the surface of the plastic film is not exposed. In this way, even when a material with poor liquid chemical resistance, such as a polyimide, is used as the plastic film, elution of the plastic film by liquid chemicals and process contamination can be prevented.

In a case that the organic EL display device 1 is the flexible display device, the lower face film is bonded to the lower face of the plastic film (the resin layer), from which the glass substrate has been peeled, in order to manufacture the organic EL display device 1 having excellent flexibility. A plastic film formed from a flexible resin is used as the lower face film. Examples of the flexible resin include polyethylene terephthalate, polyethylene naphthalate, a cycloolefin polymer, a polyimide, a polycarbonate, polyethylene, and an aramid.

TFT Layer 12

The TFT layer 12 includes a semiconductor layer 13 formed in a plurality of island shapes, a gate insulating film 14 formed on the support body 11 covering the semiconductor layer 13, a plurality of gate electrodes G and a plurality of gate wiring lines (not illustrated) formed on the gate insulating film 14, an inorganic insulating film 15 (a first passivation film) formed on the gate insulating film 14 covering the electrodes and wiring lines, a plurality of auxiliary capacitance electrodes C formed on the inorganic insulating film 15, an inorganic insulating film 16 (a second passivation film) formed on the inorganic insulating film 15 covering the auxiliary capacitance electrodes C, a plurality of source electrodes S, a plurality of drain electrodes D, a plurality of auxiliary capacitance wiring lines W, a plurality of source wiring lines (not illustrated), and a plurality of power source lines (not illustrated) formed on the inorganic insulating film 16, an organic insulating film 17 (a flattening film) formed on the inorganic insulating film 16 covering the electrodes and wiring lines, and the terminal portion 12T on which the plurality of terminals TM (terminal electrodes) for connecting to the outside are provided. Note that an inorganic insulating film (not illustrated) may be provided, as a third passivation film, on the plurality of source electrodes S, the plurality of drain electrodes D, the plurality of auxiliary capacitance wiring lines W, the plurality of source wiring lines (not illustrated), and the plurality of power source lines (not illustrated) that are formed on the inorganic insulating film 16.

The semiconductor layer 13 is formed of amorphous silicon, low-temperature polysilicon (LTPS), or an oxide semiconductor, for example. The gate insulating film 14 is formed of silicon oxide (SiOx) or silicon nitride (SiNx), or is configured by a layered film formed of these materials, for example.

The gate electrode G, the source electrode S, the drain electrode D, the auxiliary capacitance electrode C, the auxiliary capacitance wiring line W, a lead-out wiring line (not illustrated), and the terminal TM are formed of a single layer film or a layered film formed of a metal such as aluminum (Al), tungsten (W), molybdenum (Mo), tantalum (Ta), chromium (Cr), titanium (Ti), or copper (Cu), for example.

The inorganic insulating films 15 and 16 are formed of silicon oxide (SiOx) or silicon nitride (SiNx), for example. The organic insulating film 17 is formed of a photosensitive resin material such as a polyimide resin and an acrylic resin, for example.

The semiconductor layer 13, the gate electrode G, the inorganic insulating films 15 and 16, the source electrode S, and the drain electrode D configure the TFT 18.

The source electrode S and the drain electrode D are connected to the semiconductor layer 13 with a contact hole provided in the gate insulating film 14 and the inorganic insulating films 15 and 16 interposed therebetween. The source electrode S is connected to the power source line (not illustrated), for example. The drain electrode D is connected to a first electrode 21 with a contact hole extending through the organic insulating film 17 interposed therebetween. The auxiliary capacitance wiring line W is connected to the auxiliary capacitance electrode C with a contact hole provided in the inorganic insulating film 16 interposed therebetween.

Furthermore, the gate wiring line is connected to the gate electrode G, and the source wiring line is connected to the source electrode S. The gate wiring line and the source wiring line are intersected orthogonal to each other in a plan view.

Regions surrounded in a lattice pattern by the gate wiring line and the source wiring line are subpixels 3, and a single pixel 4 is formed by a set of the subpixels 3 of each of colors. In examples illustrated in FIG. 1 and FIG. 2, a red subpixel 3R, a green subpixel 3G, and a blue subpixel 3B are provided as the subpixels 3, and the single pixel 4 is formed by the red subpixel 3R, the green subpixel 3G, and the blue subpixel 3B. The TFT 18 is provided for each of the subpixels 3.

Note that, in FIG. 1, a case is illustrated, as an example, in which the TFT 18 has a top gate structure with the semiconductor layer 13 as a channel, but the TFT 18 may have a bottom gate structure.

As illustrated in FIG. 1 and FIG. 2, the organic EL display device 1 includes the display region 5 in which the subpixels 3 are arranged in a matrix pattern and on which an image is displayed and the frame region 6 which is a peripheral region surrounding the periphery of the display region 5 and on which the subpixels 3 are not arranged.

As illustrated in FIG. 1, the terminal TM is provided in the frame region 6. The terminal TM is electrically connected to the gate wiring line, for example, with the lead-out wiring line (not illustrated) interposed therebetween. The source wiring line is connected to the terminal TM (not illustrated) with the lead-out wiring line (not illustrated) interposed therebetween.

The terminal portion 12T, in which the terminals TM are provided, is provided between the display region 5 in which the organic EL elements 24 is provided and part of an edge portion 2a of the TFT substrate 10. In the example illustrated in FIG. 1 and FIG. 2, the terminal portion 12T faces one side of the TFT substrate 10 and is provided between a sealing region 8 that is surrounded by the bank BK4 (to be described later) and seals the organic EL elements 24 and an organic layer 32 (to be described later) of the sealing film 30 sealing the organic EL elements 24, and the edge portion 2a of the one side of the TFT substrate 10. However, the present embodiment is not limited to this example, and the terminal portion 12T may be provided facing two sides of the TFT substrate 10. Note that the sealing region 8 is provided in a region indicated by diagonal lines in FIG. 2, and for convenience of illustration, the sealing region 8 is illustrated in FIG. 2 only in a section corresponding to the sealing region 8 of one organic EL display device 1. However, it goes without saying that the sealing region 8 is also provided for the other organic EL display devices 1.

As illustrated in FIG. 1, the organic insulating film 17 flattens steps on the TFT 18 and the auxiliary capacitance wiring line W in the display region 5 and also covers an edge portion of the terminal TM.

A portion of the terminal TM that is not covered by the organic insulating film 17 is electrically connected to a flexible film cable, a flexible printed circuit (FPC) substrate, an external circuit such as an integrated circuit (IC) with an anisotropic conductive film (ACF) or the like interposed therebetween.

Furthermore, as illustrated in FIG. 1, the organic insulating film 17 covers an end face of the inorganic insulating film 16.

The organic insulating film 17 includes a first organic insulating film pattern portion 17A formed continuously extending from the display region 5 to the frame region 6 as a flattening film, in the frame region 6, a second organic insulating film pattern portion 17B formed in a frame shape separated from the first organic insulating film pattern portion 17A and surrounding the first organic insulating film pattern portion 17A, and a third organic insulating film pattern portion 17C covering the edge portion of the terminal TM.

The TFTs 18 and the organic EL elements 24 are provided on the first organic insulating film pattern portion 17A, but the TFTs 18 and the organic EL elements 24 are not provided on the second organic insulating film pattern portion 17B and the third organic insulating film pattern portion 17C.

OLED Layer 20

The OLED layer 20 includes the first electrode 21 (a lower electrode) formed on the organic insulating film 17, the bank BK (wall, embankment), an organic EL layer 22 formed on the first electrode 21 and formed from an organic layer including at least a light emitting layer, and a second electrode 23 (an upper electrode) formed on the organic EL layer 22.

The first electrode 21, the organic EL layer 22, and the second electrode 23 configure the organic EL element 24 (the OLED element). Note that, in the present embodiment, the layers between the first electrode 21 and the second electrode 23 are collectively referred to as the organic EL layer 22.

Furthermore, an optical adjustment layer (not illustrated) that performs optical adjustment, and a protection layer that protects the second electrode 23 such that oxygen or moisture does not penetrate into the organic EL element 24 from outside may be formed on the second electrode 23. In the present embodiment, the organic EL layer 22 formed on each of the subpixels 3, the pair of electrode layers (the first electrode 21 and the second electrode 23) that sandwich the organic EL layer 22, and the optical adjustment layer and the protection layer (not illustrated) that are formed as necessary, are referred to together as the organic EL element 24.

The first electrode 21 is formed on the organic insulating film 17, which is used as the flattening film, in the display region 5. The first electrode 21 allows holes to be injected (supplied) into the organic EL layer 22, and the second electrode 23 allows electrons to be injected into the organic EL layer 22. The holes and the electrons injected into the organic EL layer 22 are recombined in the organic EL layer 22, and thus form excitons. The formed excitons emit light as they become deactivated from an excited state to a ground state, and the emitted light is emitted to the outside from the organic EL element 24.

The first electrode 21 is electrically connected to the TFT 18 with a contact hole formed in the organic insulating film 17 interposed therebetween.

The first electrode 21 is a pattern electrode formed in an island-shaped pattern for each of the subpixels 3. Meanwhile, the second electrode 23 is a solid-like common electrode provided in common to each of the subpixels 3.

As illustrated in FIG. 2, second electrode connecting portions 7 in which second electrode connecting electrodes (not illustrated) each connected to the second electrode 23 are provided are provided along and outside one pair of sides facing each other of two pair of sides of the display region 5.

The bank BK includes the bank BK1 (a lattice-shaped bank) disposed in the display region 5 and the banks BK2 to BK4 (frame-shaped banks) disposed in the frame region 6.

A peripheral portion of the first electrode 21 is covered by the bank BK1. The bank BK1 functions as an edge cover that inhibits, at the peripheral portion of the first electrode 21, a short circuit with the second electrode 23 due to electrode concentration or thinning of the organic EL layer 22, and also functions as a subpixel isolation layer that isolates the subpixels 3 from each other such that electric current does not leak to the adjacent subpixel 3.

As illustrated in FIG. 1 and FIG. 2, in the bank BK1, a bank BK1a is provided for each of the subpixels 3. An exposed portion of the first electrode 21 exposed by the bank BK1a forms a light emitting region of each of the subpixels 3.

In a case that, for the organic EL layer 22 of the organic EL element 24, separate patterning is performed such that a different color light is emitted for each of the subpixels 3, as illustrated in FIG. 1, the organic EL layer 22 is formed for each of the regions (the subpixel 3) surrounded by the bank BK1a. Thus, the organic EL display device 1 illustrated in FIG. 1 emits red color light from the red subpixel 3R, emits green color light from the green subpixel 3G, and emits blue color light from the blue subpixel 3B. In this way, in a case that the organic EL display device 1 is provided with the organic EL element 24 formed using the RGB separate patterning method, full color image display can be performed using the red color light, the green color light, and the blue color light, without using a color filter.

For example, the organic EL layer 22 is configured by layering a hole injecting layer, a hole transport layer, a light emitting layer, an electron transport layer, and an electron injecting layer, in this order from the first electrode 21 side. Note that a single layer may have a plurality of functions. For example, in place of the hole injection layer and the hole transport layer, a hole injection-cum-transport layer having the functions of both these layers may be provided. In addition, in place of the electron injection layer and the electron transport layer, an electron injection-cum-transport layer having the functions of both these layers may be provided. In addition, a carrier blocking layer may be provided between the layers as appropriate.

Note that the above-described layering order is for a case in which the first electrode 21 is an anode electrode and the second electrode 23 is a cathode electrode, and when the first electrode 21 is the cathode electrode and the second electrode 23 is the anode electrode, the order of each of the layers configuring the organic EL layer 22 is inverted.

In a case that the organic EL display device 1 is a bottom-emitting type configured to emit light from the back surface side of the support body 11, it is preferable that the second electrode 23 be formed by a reflective electrode material, and the first electrode 21 be formed by a transparent or semi-transparent light-transmissive electrode material.

A transparent conductive film such as indium tin oxide (ITO) and indium zinc oxide (IZO), or a thin film of a metal such as gold (Au), platinum (Pt), and nickel (Ni) can be used as the first electrode 21, for example. To inject electrons into the light emitting layer, a metal with a small work function, such as lithium (Li), cerium (Ce), barium (Ba), and aluminum (Al), or an alloy containing these metals, such as a magnesium alloy (MgAg or the like) and an aluminum alloy (AlLi, AlCa, AlMg, or the like), is used as the second electrode 23.

Meanwhile, in a case that the organic EL display device 1 is a top-emitting type configured to emit light from the sealing film 30 side, it is preferable that the first electrode 21 be formed by a reflective electrode material, and the second electrode 23 be formed by a transparent or semi-transparent light-transmissive electrode material.

The first electrode 21 and the second electrode 23 may each have a single layer structure or may each have a layered structure. For example, in a case that the organic EL element 24 is a top-emitting organic EL element, the first electrode 21 may have a layered structure configured by a reflective electrode and a transparent electrode.

Of the banks BK1 to BK4, the bank BK1 is formed on the organic insulating film 17 in the display region 5. Meanwhile, the banks BK2 and BK3 are formed on the organic insulating film 17 in the frame region 6. The bank BK4 is formed on the inorganic insulating film 15 in the frame region 6.

More specifically, the bank BK1 is provided in a lattice pattern in a plan view, for example, on the first organic insulating film pattern portion 17A in the display region 5, covering each edge of each of the first electrodes 21 arranged in a matrix pattern. The bank BK2 is formed in a frame shape on the first organic insulating film pattern portion 17A in the frame region 6, surrounding the display region 5.

The bank BK2 is formed by a plurality of dot-shaped banks BK2*a* that are separated from each other, and each of the dot-shaped banks BK2*a* is arranged in a plurality of rows to form an intermittent frame shape. As illustrated in FIG. 2, for example, the bank BK2 has a configuration in which the dot-shaped banks BK2*a* of the adjacent rows are disposed regularly in a staggered shape with respect to each other in a plan view.

The bank BK3 is formed in a frame shape on the second organic insulating film pattern portion 17B while surrounding the bank BK2. The bank BK3 is formed by a plurality of dot-shaped banks BK3*a* that are separated from each other, and each of the dot-shaped banks BK3*a* is arranged in a plurality of rows to form an intermittent frame shape. As illustrated in FIG. 2, for example, the bank BK3 has a configuration in which the dot-shaped banks BK3*a* of the adjacent rows are arranged regularly in a staggered shape with respect to each other in a plan view.

The bank BK4 is formed on the outer side of the second organic insulating film pattern portion 17B in a frame shape formed from a continuous line, rather than in a dot shape, surrounding the second organic insulating film pattern portion 17B.

Note that, to improve coverage of a formation surface on which each of the banks BK is formed, a cross-section thereof is preferably a forwardly tapered shape.

In the present embodiment, as illustrated in FIG. 2, the display region 5 is formed in a quadrilateral shape. Thus, the outer shape of the first organic insulating film pattern portion 17A is formed, corresponding to the quadrilateral-shaped display region 5, in a quadrilateral shape having a substantially similar shape to the outer shape of the display region 5. Furthermore, the outer shapes (the outer edge shapes of the frames) of the second organic insulating film pattern portion 17B and the bank BK4 surrounding the first organic insulating film pattern portion 17A are also formed in a quadrilateral shape having a substantially similar shape to the outer shape of the display region 5.

Note that four corner portions of each of the first organic insulating film pattern portion 17A, the second organic insulating film pattern portion 17B, and the bank BK4 may be curved line portions as illustrated in FIG. 2, or may have right angles.

The first organic insulating film pattern portion 17A is formed such that a straight line distance from each edge portion of the display region 5 to each inner side face of the first organic insulating film pattern portion 17A facing each edge portion is constant. Furthermore, the second organic insulating film pattern portion 17B is formed such that a straight line distance from each outer side face of the first organic insulating film pattern portion 17A to each inner side face of the second organic insulating film pattern portion 17B facing each outer side face is constant. The bank BK4 is formed such that a straight line distance from each outer side face of the second organic insulating film pattern portion 17B to each inner side face of the bank BK4 facing each outer side face is constant.

As described above, the frame-shaped bank BK2, the frame-shaped bank BK3, and the frame-shaped bank BK4 are formed on the outer side of the lattice-shaped banks BK1, and are provided in this order from the inside to the outside with the lattice-shaped banks BK1 at the center.

The banks BK1 to BK4 are formed from an organic insulating material. The banks BK1 to BK4 are formed, for example, from a photosensitive resin, such as an acrylic resin, or a polyimide resin. The banks BK1 to BK4 can be formed in the same step, for example.

When forming the organic layer 32 of the sealing film 30, which will be described below, the banks BK2 to BK4 define edges of the organic layer 32 by reducing the flow rate of a liquid organic insulating material (ink), which is a material of the organic layer 32, in stages, thereby regulating wet-spreading of the organic insulating material.

In particular, after the liquid organic insulating material that forms the organic layer 32 is applied using the ink-jet method or the like, the dot-shaped banks BK2*a* and BK3*a* align edges of the wetly spreading liquid organic insulating material, block the flow of the wetly spreading organic insulating material, and align edge portions of the organic insulating material to be in a substantially straight line shape.

Furthermore, since the organic insulating material wetly spreads while passing through the banks BK2 and BK3, the banks BK2 and BK3 function as resistance. As a result of passing through the banks BK2 and BK3, the speed of the wet-spreading of the organic insulating material decreases. According to the present embodiment, by providing the banks BK2 and BK3 closer to the display region 5 than the bank BK4 in this way, the flow of the organic insulating material can be blocked, and an overflow of the organic insulating material beyond the bank BK4 to the outside (particularly, reaching onto the terminal portion 12T) can be prevented.

Furthermore, the second organic insulating film pattern portion 17B is separated from the first organic insulating film pattern portion 17A, and thus the second organic insulating film pattern portion 17B on which the bank BK3 is provided is used as a first dam portion DM1 configured to prevent moisture from penetrating into the TFTs 18 and the organic EL elements 24 inside the first organic insulating film pattern portion 17A.

At the bank BK4 that functions as an organic layer stopper, the organic insulating material that forms the organic layer 32 is held back by the bank BK4, while covering edge portions of the bank BK4 closer to the bank BK3. As a result, the organic layer 32 comes in contact with the edge portions of the bank BK4 closer to the bank BK3, with a first inorganic layer 31 interposed therebetween.

Since the bank BK4 is separated from the first organic insulating film pattern portion 17A and the second organic insulating film pattern portion 17B, the bank BK4 is used as a second dam portion DM2 configured to prevent moisture from penetrating into the TFTs 18 and the organic EL elements 24 inside the first organic insulating film pattern portion 17A.

Furthermore, although not illustrated, in the present embodiment, the second electrode 23 is formed covering the bank BK2 formed along a side of the first organic insulating film pattern portion 17A on which the second electrode connecting portion 7 is provided.

Thus, since the bank BK2 is formed by the plurality of dot-shaped banks BK2a, the second electrode 23 is formed covering the steps of the dot-shaped banks BK2a, and at the same time, is formed on planar portions located in gaps between the dot-shaped banks BK2a. Since the bank BK2 is formed by the plurality of dot-shaped banks BK2a in this way, the second electrode 23 and the second electrode connecting portion 7 can be reliably made conductive.

Sealing Film 30

The sealing film 30 includes the first inorganic layer 31 (a lower layer inorganic sealing layer), the organic layer 32 (a first organic sealing layer), and a second inorganic layer 33 (an upper layer inorganic sealing layer), layered in this order from the TFT substrate 10 side.

The first inorganic layer 31 and the second inorganic layer 33 have a moisture-proof function to prevent the penetration of moisture, and function as barrier layers to inhibit deterioration of the organic EL element 24 caused by moisture or oxygen.

The organic layer 32 is used as a buffer layer (a stress relief layer), which relieves stress in the first inorganic layer 31 and the second inorganic layer 33 in which film stress is large, performs leveling by burying step portions and foreign matter on the surface of the organic EL element 24 and filling of pinholes, and further, prevents a crack in the second inorganic layer 33 from occurring in a case that the second inorganic layer 33 is layered, by leveling an underlayer of the second inorganic layer 33.

The first inorganic layer 31 and the second inorganic layer 33 are each formed by CVD, for example, and each can be formed by a silicon oxide film, a silicon nitride film, or a silicon oxynitride film, or by a layered film of these films.

The organic layer 32 is a light-transmissive organic insulating film that is thicker than the first inorganic layer 31 and the second inorganic layer 33, and may be formed of a photosensitive resin such as a polyimide resin, an acrylic resin, and an epoxy resin. The organic layer 32 can be formed, for example, by performing ink-jet application of an ink including this type of photosensitive resin as the organic insulating material onto the first inorganic layer 31, and then performing ultraviolet (UV) curing.

The first inorganic layer 31 is formed on the support body 11 over the whole surface of the display region 5 and the frame region 6, apart from a region positioned on a line passing over the terminal TM, covering, in a plan view, the second electrode 23, the organic insulating film 17 apart from a part of the terminal portion 12T (more specifically, the first organic insulating film pattern portion 17A, the second organic insulating film pattern portion 17B, and an edge portion of the third organic insulating film pattern portion 17C closer to the second organic insulating film pattern portion 17B), the inorganic insulating film 15, the bank BK that is not covered by the second electrode 23 (a part of the bank BK2, and the banks BK3 and BK4), and the eaves body 41.

However, the first inorganic layer 31 includes split portions 31a that face wall surfaces of the eaves body 41 and are split apart along protruding portions 41a of the eaves body 41 (to be described below).

In addition to covering the first organic insulating film pattern portion 17A, the second organic insulating film pattern portion 17B, the organic EL elements 24, and the banks BK1 to BK3, the organic layer 32 preferably covers the edge portion of the bank BK4 closer to the bank BK3 and an upper portion of the bank BK4, with the first inorganic layer 31 interposed therebetween. However, it is sufficient that the organic layer 32 at least partially covers the second organic insulating film pattern portion 17B, and the organic layer 32 may cover an edge portion of a bank BK4 closer to the bank BK3 and an upper portion of the bank BK4, with the first inorganic layer 31 interposed therebetween. The organic layer 32 is provided in the sealing region 8 surrounded by the bank BK4 serving as the organic layer stopper and is configured to seal the organic EL elements 24.

The second inorganic layer 33 is formed superimposing on the first inorganic layer 31. In a case that a cross section of the organic layer 32 is exposed, moisture or the like penetrates from this cross section. Thus, to prevent the cross section of the organic layer 32 from being exposed, the second inorganic layer 33 covers the first inorganic layer 31 so as to seal the organic layer 32 between the first inorganic layer 31 and the second inorganic layer 33.

The second inorganic layer 33 is formed on the first inorganic layer 31 over the whole surface of the display region 5 and the frame region 6, apart from the region located on the line passing over the terminals TM, covering, in a plan view, the second electrode 23, the organic insulating film 17 apart from the part of the terminal portion 12T (specifically, the first organic insulating film pattern portion 17A, the second organic insulating film pattern portion 17B, and the edge portion of the third organic insulating film pattern portion 17C closer to the second organic insulating film pattern portion 17B), the inorganic insulating film 15, the bank BK that is not covered by the second electrode 23 (the part of the bank BK2, and the banks BK3 and BK4), and the eaves body 41, with at least the first inorganic layer 31, of the first inorganic layer 31 and the organic layer 32, interposed therebetween.

However, the second inorganic layer 33 includes split portions 33a that face wall surfaces of the protruding portions 41a and are split apart along the protruding portions 41a of the eaves body 41 (to be described below).

Note that, as described above, an inorganic layer or an organic layer (not illustrated), such as the optical adjustment layer or the electrode protection layer, may be formed between the second electrode 23 and the sealing film 30.

Eaves Body 41

The eaves body 41 is formed, on the TFT substrate 10, facing an edge portion of the TFT substrate 10 on which the inorganic sealing film of the sealing film 30 (the first inorganic layer 31 and the second inorganic layer 33 in the present embodiment) is provided (in other words, facing the edge portion 2a of the organic EL substrate 2 on which the inorganic sealing film is provided, and as illustrated in FIG. 2, facing a division line DL of the mother substrate 50 before the singulation of the organic EL substrate 2).

In the present embodiment, the organic EL substrate 2 is formed in a rectangular shape in a plan view, and the terminal portion 12T is formed facing one side of four sides of the organic EL substrate 2. Then, the inorganic sealing film is provided on the edge portions 2a of the three sides of the organic EL substrate 2 apart from the one side facing the terminal portion 12T, and the eaves body 41 is provided along each of the edge portions 2a of the three sides, on the inner side of each of the edge portions 2a of the three sides.

The eaves body 41 includes the protruding portion 41a (an eaves portion), which is provided on at least one edge portion of edge portions (sides) of the eaves body 41 provided along the edge portion 2a so as to face the edge portion 2a on which the inorganic sealing film is provided, and which protrudes in an in-plane direction above the surface of the TFT substrate 10 in contact with the eaves body 41 in a cross-sectional view.

As illustrated in FIG. 1, the eaves body 41 according to the present embodiment is, for example, a reversely tapered resin film having a reversely tapered shape in a cross-sectional view, in which the protruding portion 41a is provided on each of the edge portions (sides) of the eaves body 41 provided along and facing the edge portion 2a on which the inorganic sealing film is provided.

Note that, here, in a plan view, each of the edge portions of the eaves body 41 along the edge portion 2a refers to an outer edge portion located on the finally formed organic EL display device 1 outer side (in other words, the edge portion closer to the edge portion 2a), and an inner edge portion located on the organic EL device 1 inner side (in other words, the edge portion closer to the display region 5 and located on a side opposite to the edge portion 2a). Note that, as described above, "the outer side" or "closer to the edge portion 2a" can be interpreted as being closer to the division line DL of the mother substrate 50, at stages before the singulation of the organic EL substrate 2.

A height h of the eaves body 41 preferably has a height of at least 1 μm, and more preferably has a height of at least 4 μm. Furthermore, the height h of the eaves body 41 preferably has a height that is at least twice the thickness of the first inorganic layer 31 and the second inorganic layer 33 layered on the eaves body 41. The first inorganic layer 31 and the second inorganic layer 33 each having the same thickness as that on the display region 5 are layered on the eaves body 41. The first inorganic layer 31 and the second inorganic layer 33 each have the thickness of 500 nm, for example, and are preferably each formed having a thickness of at least 1 μm. By setting the height h of the eaves body 41 to be the above-described height, splitting of the first inorganic layer 31 and the second inorganic layer 33 easily occurs.

Furthermore, a width d (a line width) of the eaves body 41 is preferably at least 1.5 times the height h of the eaves body 41, and more preferably at least twice the height h. In a case that the width d of the eaves body 41 is less than 1.5 times the height h of the eaves body 41, the inorganic sealing film on the eaves body 41 and the inorganic sealing film below the eaves body 41 may be connected at a side surface of the eaves body 41, or the eaves body 41 (more specifically, the resin film forming the eaves body 41) may easily peel off from the TFT substrate 10. The width d of the eaves body 41 is preferably at least 6 μm, more preferably at least 8 μm, and particularly preferably at least 10 μm.

Furthermore, an angle formed by the eaves body 41 and the surface of the TFT substrate 10 in contact with the eaves body 41 (in other words, an angle formed by the eaves body 41 and the horizontal surface: hereinafter referred to as a "taper angle θ") is preferably at least 135° (but less than 180°), for example. By setting the taper angle θ to the above-described angle, the splitting of the first inorganic layer 31 and the second inorganic layer 33 easily occurs.

From a functional perspective of the eaves body 41, upper limits of the height h and the width d of the eaves body 41 are not particularly limited to specific values. However, since the larger the height h and the width d of the eaves body 41, the larger the organic EL display device 1 becomes, permissible ranges thereof may be appropriately set in accordance with the outer shape of the organic EL display device 1.

The eaves body 41 is formed on the outer side of the second electrode connecting portion 7 in order to stop a crack from spreading into the display region 5. Thus, the eaves body 41 is formed between the second electrode connecting portion 7 and the edge portion 2a of the organic EL substrate 2.

In the present embodiment, the eaves body 41 is formed on the outer side of the organic layer 32 sandwiched by the first inorganic layer 31 and the second inorganic layer 33, in other words, on the outer side of the sealing region 8. Thus, in the present embodiment, the eaves body 41 is formed between the sealing region 8 and the edge portion 2a of the organic EL substrate 2.

Cover Body

As described above, a cover body (not illustrated) is provided on the sealing film 30. The cover body is a function layer having at least one of a protection function, an optical compensation function, and a touch sensor function, and, in a case that the organic EL display device 1 is the flexible display device, for example, the cover body may be a protection film that functions as a support body when the glass substrate is peeled off. Furthermore, in a case that the organic EL display device 1 is a non-bendable and rigid display device, the cover body may be a counter substrate such as the glass substrate, and a filling layer formed from a filling material (not illustrated) may further be provided between the counter substrate and the organic EL substrate 2.

In addition, the cover body may be provided with a function film, such as a polarizing film and a touch sensor film, or may be provided with a polarizer, a touch panel, and the like.

Method for Manufacturing Organic EL Display Device 1

Next, with reference to FIG. 1 to FIG. 4, a method for manufacturing the organic EL display device 1 will be described below.

Figure 3A:
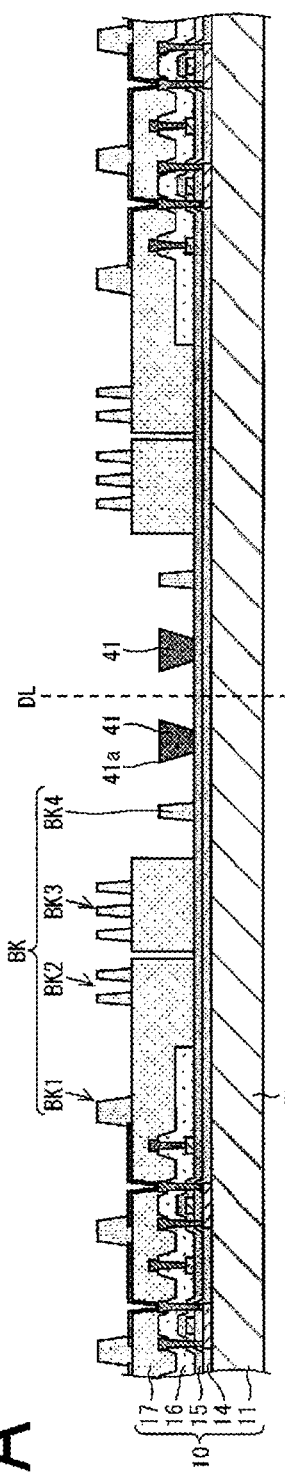
FIGS. 3A to 3C are cross-sectional views illustrating manufacturing steps of main portions of an organic EL display device according to the first embodiment of the disclosure in order of the steps.
Figure 3B:
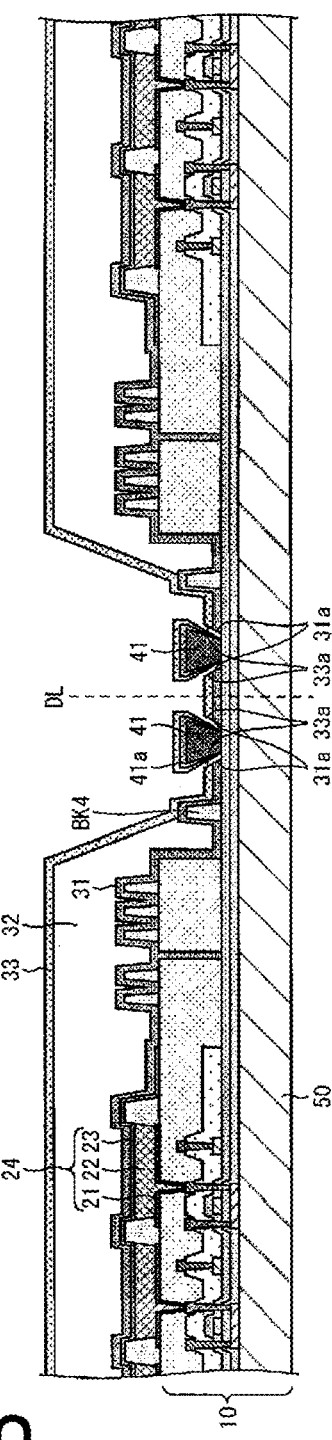
Figure 3C:
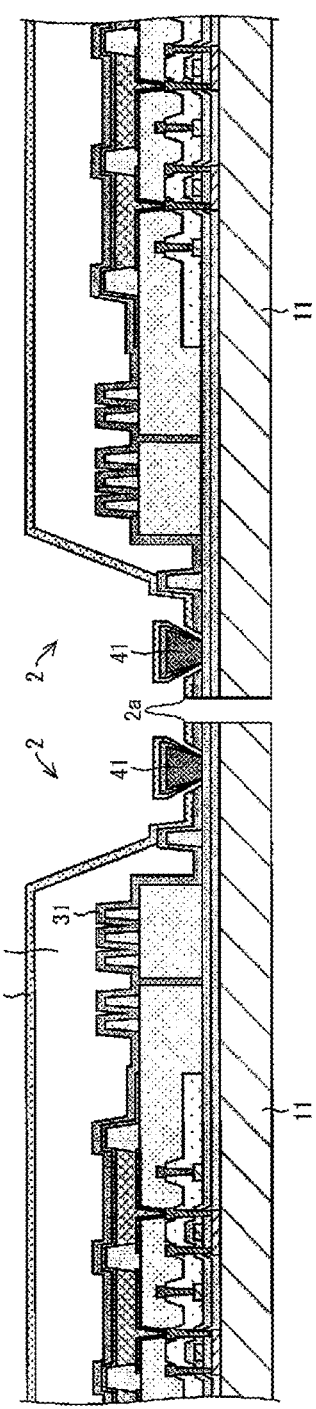
Figure 4:
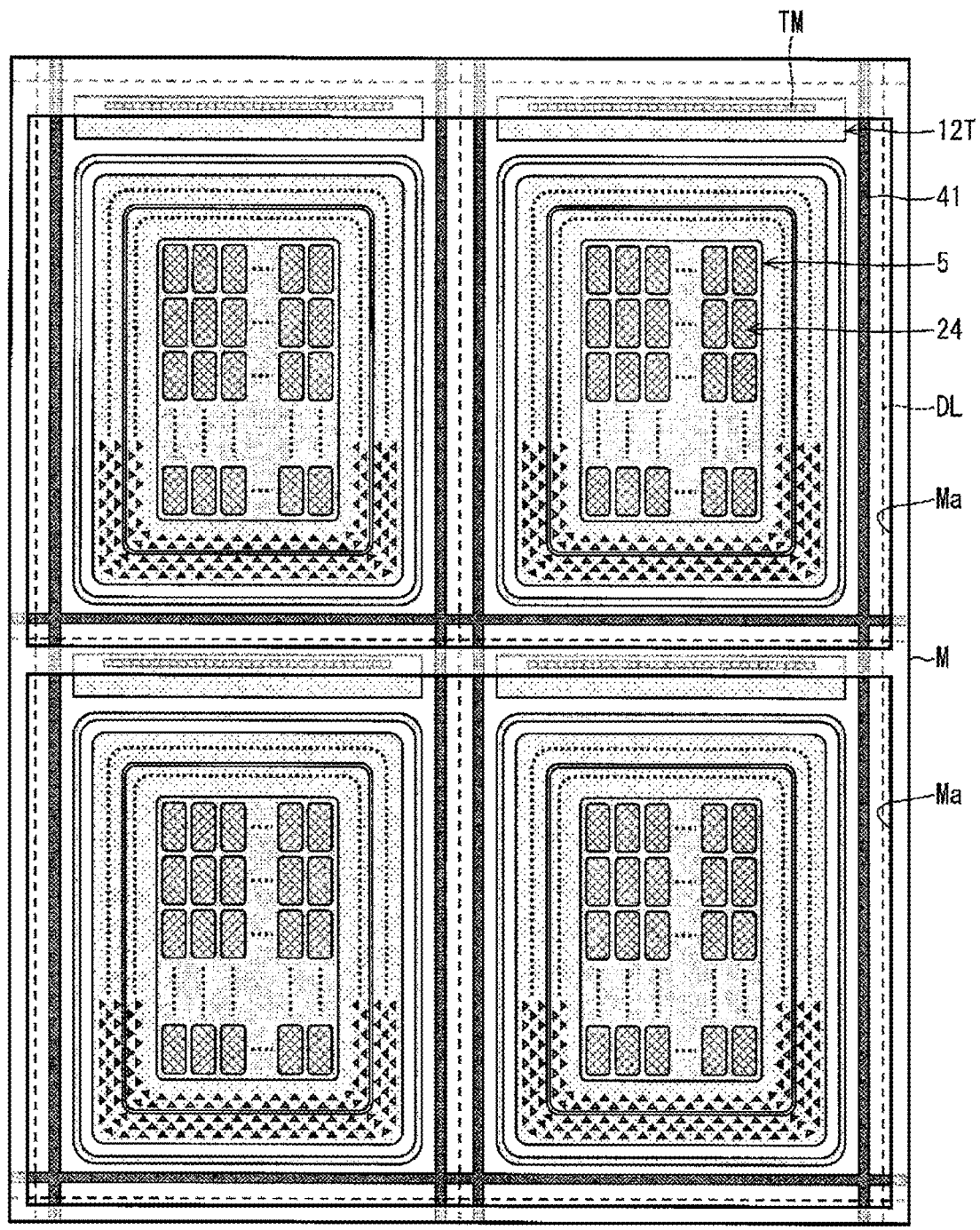
FIG. 4 is a plan view illustrating a film forming step of a first inorganic layer and a second inorganic layer of an organic EL display device according to the first embodiment of the disclosure.

FIGS. 3A to 3C are cross-sectional views illustrating manufacturing steps of main portions of the organic EL display device 1 according to the present embodiment in order of the steps. FIGS. 3A to 3C each illustrate a cross section of the organic EL display device 1 illustrated in FIG. 2 taken along a line B-B in the direction of the arrows. Further, FIG. 4 is a plan view illustrating a film forming step of the first inorganic layer 31 and the second inorganic layer 33.

First, as illustrated in FIG. 1, on the mother substrate 50 (see FIG. 2) configuring the support body 11 and formed by a large glass substrate or the like, the semiconductor layer 13, the gate insulating film 14 formed on the support body 11 covering the semiconductor layer 13, the plurality of gate electrodes G and the plurality of gate wiring lines (not illustrated) formed on the gate insulating film 14, the inorganic insulating film 15 covering the electrodes and wiring lines formed on the gate insulating film 14, the plurality of auxiliary capacitance electrodes C formed on the inorganic insulating film 15, the inorganic insulating film 16 formed on the inorganic insulating film 15 covering the auxiliary capacitance electrodes C, the plurality of source electrodes S, the plurality of drain electrodes D, the plurality of auxiliary capacitance wiring lines W, the plurality of source wiring lines (not illustrated), and the plurality of power source lines (not illustrated) that are formed on the inorganic insulating film 16, and the terminal portion 12T including the plurality of terminals TM are formed by a known method (a known TFT step).

Note that in a case that the organic EL display device 1 is the flexible display device, as the mother substrate 50, a substrate is used that is obtained by forming a resin layer (a plastic film), such as a polyimide layer, and a moisture-proof layer, which configure the support body 11, on a large carrier substrate such as a glass substrate.

Next, a photosensitive resin, such as an acrylic resin or a polyimide resin, is applied to the mother substrate 50 on which these wiring lines and the like are formed, and patterning is performed thereon by photolithography or the like, thus forming the organic insulating film 17 by the known method (the known TFT step). At this time, in the present embodiment, as the organic insulating film 17, the organic insulating film 17 is formed that includes the first organic insulating film pattern portion 17A, the second organic insulating film pattern portion 17B, and the third organic insulating film pattern portion 17C. In this way, the mother substrate 50, on which the TFT layer 12 is formed, is formed as the TFT substrate 10.

Next, the known method (the known TFT step), such as a sputtering method, is used to pattern form the first electrode 21 in the matrix shape. At this time, the first electrode 21 is electrically connected to the drain electrode D with the contact hole formed in the organic insulating film 17 interposed therebetween.

Next, the known method (the known TFT step), such as the sputtering method, is used to pattern form the bank BK. Specifically, an organic film (not illustrated) that is formed, for example, from a photosensitive resin such as an acrylic resin or a polyimide resin, is formed covering the first electrode 21, the organic insulating film 17, and the inorganic insulating films 15 and 16. Then, as illustrated in FIG. 1 and FIG. 3A, the bank BK formed by the organic film are pattern formed by photolithography or the like. At this time, in the present embodiment, the banks BK1 to BK4 are formed as the bank BK. Note that each of the banks BK1 to BK4 can be pattern formed using the same material in the same step. However, the banks BK1 to BK4 may also be formed in separate steps using mutually different masks and materials.

Next, an organic film (not illustrated) formed from a resin, such as a photosensitive resin, is formed on the TFT substrate 10, and the reversely tapered eaves body 41 (the reversely tapered resin film) including the protruding portions 41a protruding in the in-plane direction are pattern formed along the division line DL, as illustrated in FIG. 2 and FIG. 3A. Here, the division line DL refers to a scheduled division line along which the mother substrate 50 is divided and singulated into the organic EL substrates 2 corresponding to the individual organic EL display devices 1.

A permanent film photoresist can be used as the photosensitive resin, and a permanent film can be formed by curing the permanent film photoresist. Examples of the permanent film photoresist include the ZPN series (a trade name), which are resist materials manufactured by Zeon Corporation.

The reversely tapered eaves body 41 can be formed by using a negative-type photosensitive resin while making use of a difference in development speed resulting from a difference in the amount of exposure in the thickness direction, for example. In a case that UV-exposure is performed using the negative-type photosensitive resin and using a photomask including an opening that exposes a region in which the eaves body 41 is formed, since the photosensitive resin remains undissolved on the upper surface side thereof due to sufficient exposure, while, on the lower side, the amount of exposure gradually decreases toward the lower side, a photosensitive resin layer having a reversely tapered pattern is formed. By heating and curing the photosensitive resin layer having the reversely tapered pattern, for example, and turning it into the permanent film, the reversely tapered eaves body 41 can be formed.

Note that, for example, in a case that the bank BK is formed using the negative-type photosensitive resin, the same material as that of the bank BK may be used for the organic film, and the bank BK and the eaves body 41 may be pattern formed in the same step using the same material as the bank BK.

After that, as illustrated in FIG. 1 and FIG. 3B, the organic EL layer 22 is formed by separate patterning vapor deposition, corresponding to each of the subpixels 3R, 3G, and 3B, such that light emitting layers of each color cover the region surrounded by the bank BK1 (namely, the opening). Note that in the film formation of the organic EL layer 22, a method other than the vapor deposition method may be used, such as a paint-on method, the ink-jet method, or a printing method.

To perform the full color display, as an example, the light emitting layers can be pattern formed by the separately patterning vapor deposition, that is, for each of the light emission colors, as described above. However, the present embodiment is not limited to this example, and, to perform the full color display, a configuration may be used in which the white color light emitting organic EL element 24 that uses a white color (W) light emitting layer configured to emit white light, is used in combination with a color filter (CF) layer (not illustrated), and the light emission color for each of the subpixels 3 is selected. Furthermore, while using the light emitting layer whose light emission color is the color W, the full color image display may be realized by introducing a microcavity structure for each of the subpixels 3. Note that, when changing the light emission color of each of the subpixels 3 using the method using the CF layer, the microcavity structure, or the like, it is not necessary for the light emitting layers to be separately patterned for each of the subpixels 3.

Next, the second electrode 23 is pattern formed by vapor deposition using a vapor deposition mask, for example, over the whole surface of the display region 5 on the TFT substrate 10 covering the organic EL layer 22 and the bank BK1, so as to be electrically connected to the second electrode connecting electrode of the second electrode connecting portion 7 and to expose regions other than these regions.

In this way, the organic EL element 24 formed by the first electrode 21, the organic EL layer 22, and the second electrode 23 can be formed on the TFT substrate 10.

Next, as illustrated in FIG. 4, a CVD mask M, which includes a plurality of openings Ma, is disposed facing the TFT substrate 10 on which the organic EL elements 24 are formed as illustrated in FIG. 3B. The CVD mask M is disposed such that, in a plan view, the lines passing over each of the terminals TM of the adjacent plurality of terminal portions 12T on either side of the division line DL are covered, and such that, of the four sides of the organic EL substrate 2 of each of the display regions 5 (in other words, the four sides of the quadrilateral region surrounded by the division lines DL), at least the division line on the side on which the terminal portion 12T is not provided is positioned inside the opening Ma, and such that the region surrounding the division line on the side on which the terminal portion 12T is not provided is open.

Then, the first inorganic layer 31 formed from silicon nitride, silicon oxide, or the like is formed by CVD or the like over the whole surface of the display region 5 and the frame region 6, apart from the lines passing over the terminals TM that are covered by the mask M, covering the second electrode 23, the organic insulating film 17 apart from the part of the terminal portion 12T (specifically, the first organic insulating film pattern portion 17A, the second organic insulating film pattern portion 17B, and the edge portion of the third organic insulating film pattern portion 17C closer to the second organic insulating film pattern portion 17B), the inorganic insulating film 15, and the bank BK that is not covered by the second electrode 23 (the part of the bank BK2, and the banks BK3 and BK4), and the eaves body 41.

As a result, the first inorganic layer 31 covering the division line DL of the mother substrate 50 is formed, as illustrated in FIG. 3B.

Next, the liquid organic insulating material (the ink) including the photosensitive resin is applied over the whole surface of the display region 5 using the ink-jet method or the like.

Next, the liquid organic insulating material that is wetly spread inside the region surrounded by the bank BK4 is cured. As a result, the organic layer 32 whose edge portions have a uniform film thickness along the bank BK4 is formed.

After that, the second inorganic layer 33 formed of silicon nitride, silicon oxide, or the like is formed by CVD or the like such that the first inorganic layer 31 and the second inorganic layer 33 seal the organic layer 32 and the organic EL elements 24.

The second inorganic layer 33 covers the division line DL of the mother substrate 50, and is formed over the whole surface of the display region 5 and the frame region 6, apart from the regions positioned on the lines passing over the terminals TM, which are covered by the mask M, using the mask M illustrated in FIG. 4 in the same manner as for the first inorganic layer 31.

In this way, the sealing film 30 configured by the first inorganic layer 31, the organic layer 32, and the second inorganic layer 33 is formed.

For example, plasma CVD is used for forming the first inorganic layer 31 and second inorganic layer 33. As illustrated in FIG. 3B, the organic layer 32 is held back by the bank BK4 so as to remain inside the region surrounded by the bank BK4. Thus, the sealing film 30 on the eaves body 41 and around the eaves body 41 does not include the organic layer 32, and only the first inorganic layer 31 and the second inorganic layer 33 are layered therein.

In the CVD used for forming an inorganic sealing film, a low temperature that is 80° C. or lower is generally used, for example, in order to prevent thermal damage to a function layer (specifically, an EL layer such as the organic EL layer 22) of the light emitting element, and the substrate temperature has a similar temperature. Thus, film growth on the substrate is unlikely to occur, and performance for covering a step is low even in a case that the plasma CVD is used.

Thus, as described above, in a case that the eaves body 41 including the protruding portions 41a protruding in the in-plane direction above the surface of the TFT substrate 10 is formed on the TFT substrate 10 for which the mother substrate 50 serves as the support body, the inorganic sealing film, such as the first inorganic layer 31 and the second inorganic layer 33, is not formed on the wall surfaces of the eaves body 41, which are shadowed by the protruding portions 41a, and also is not formed on the TFT substrate 10 positioned below the protruding portions 41a.

As a result, as illustrated in FIG. 3B, the inorganic sealing film (in the present embodiment, the first inorganic layer 31 and the second inorganic layer 33) is naturally split apart along the wall surfaces of the eaves body 41. In this way, the split portions 31a of the first inorganic layer 31 and the split portions 33a of the second inorganic layer 33, which face the wall surfaces of the eaves body 41, are formed along the protruding portions 41a of the eaves body 41.

Note that the split portions 31a of the first inorganic layer 31 and the split portions 33a of the second inorganic layer 33 are splits naturally formed during the film formation of each of the films (specifically, during the film formation of the first inorganic layer 31, and during the film formation of the second inorganic layer 33). Therefore, unlike a case in which the inorganic sealing film is physically cut after the formation of the inorganic sealing film (after the film formation of the first inorganic layer 31 and the second inorganic layer 33, for example), when the first inorganic layer 31 is split apart and when the second inorganic layer 33 is split apart, a subsequent crack does not occur in the first inorganic layer 31 and the second inorganic layer 33.

Note that the first inorganic layer 31 and the second inorganic layer 33 having the same film thickness as those of the first inorganic layer 31 and the second inorganic layer 33 in the display region 5 are formed on the eaves body 41 (more specifically, on the top surface of the eaves body 41).

Next, after a protection film or the like (not illustrated) is bonded onto the sealing film 30, the mother substrate 50 on which the TFT layer 12, the OLED layer 20, the eaves body 41, and the sealing film 30 are formed is divided (diced) along the division line DL such that the first inorganic layer 31 and the second inorganic layer 33 are divided around each of the display regions 5 on the mother substrate 50. As a result, the mother substrate 50, on which the TFT layer 12, the OLED layer 20, the eaves body 41, and the sealing film 30 are formed, is singulated into the individual organic EL substrates 2, as illustrated in FIG. 3C. Note that, for the dividing, a laser, a metal blade, or the like can be used.

Note that, in a case that the organic EL display device 1 is the flexible display device, after the protection film or the like is bonded onto the sealing film 30, using laser irradiation, the carrier substrate is then peeled by ablation at an interface between the carrier substrate and the resin layer (the plastic film) of the mother substrate 50. Then, after the lower face film is bonded to the peeling surface, the singulation of the organic EL substrate 2 is performed. In this way, the organic EL display device 1 according to the present embodiment is formed.

Note that, after that, as necessary, a function film such as a polarizing film and a touch sensor film, a polarizer, a touch panel, or the like may be bonded to the organic EL substrate 2, and as a result, the organic EL display device 1 according to the present embodiment may be formed.

Advantageous Effects

Figure 5A:
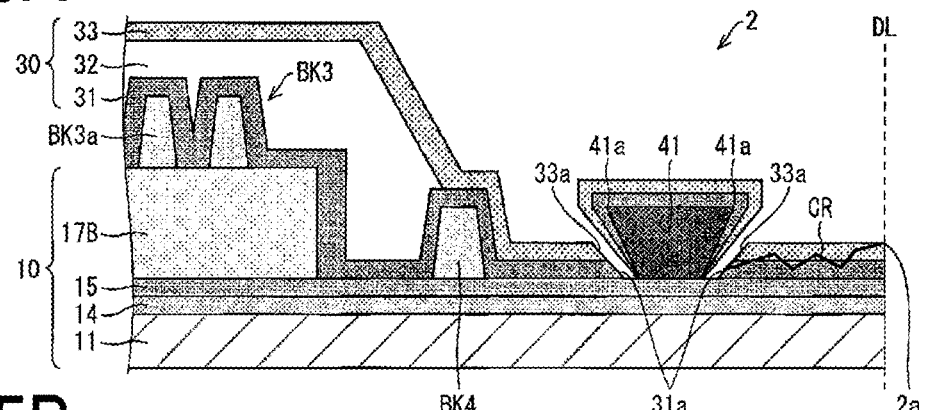
FIG. 5A is a cross-sectional view illustrating a schematic configuration of a vicinity of a division line during singulation of an organic EL substrate according to the first embodiment of the disclosure.
Figure 5B:
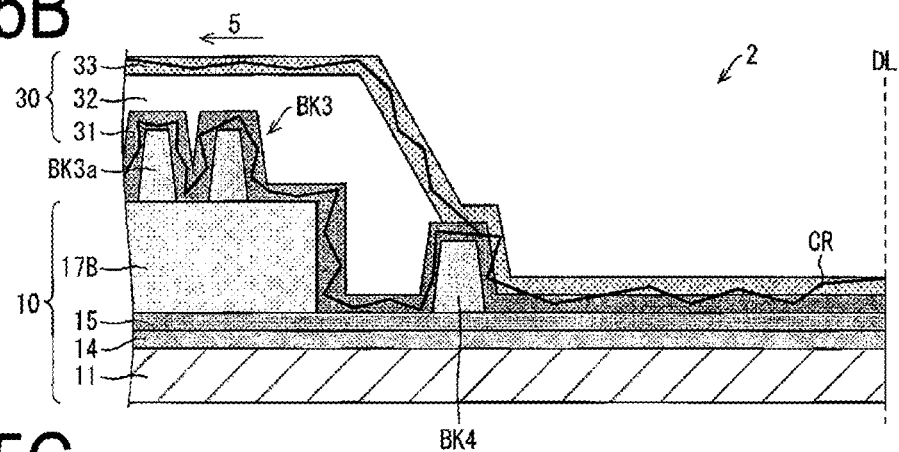
FIG. 5B is a cross-sectional view illustrating a schematic configuration of the vicinity of the division line during the singulation of the organic EL substrate, in a case that a first inorganic layer and a second inorganic layer of a sealing film are formed on the division line on the organic EL substrate on which an eaves body is not formed.
Figure 5C:
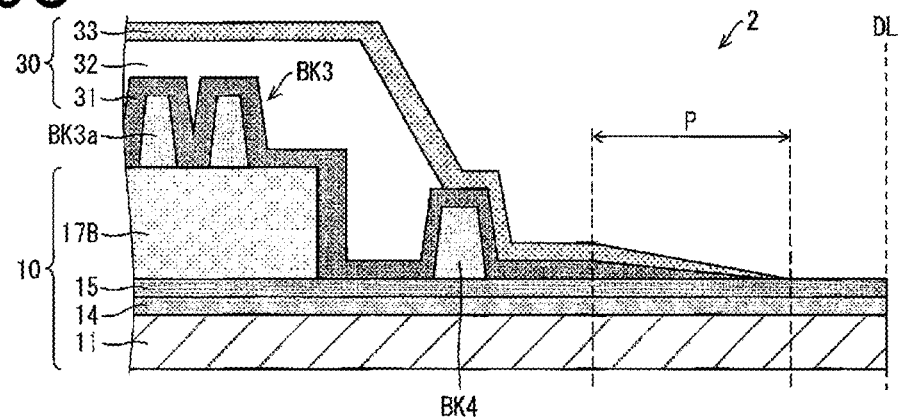
FIG. 5C is a cross-sectional view illustrating a schematic configuration of the vicinity of the division line during the singulation of the organic EL substrate, in a case that the sealing film is formed so as to be separated from the division line while using a CVD mask.

FIG. 5A is a cross-sectional view illustrating a schematic configuration of the vicinity of the division line DL at the time of singulating the organic EL substrate 2 according to the present embodiment, FIG. 5B is a cross-sectional view illustrating a schematic configuration of the vicinity of the division line DL at the time of singulating the organic EL substrate 2 when the first inorganic layer 31 and the second inorganic layer 33 of the sealing film 30 are formed on the division line DL of the organic EL substrate 2 on which the eaves body 41 is not formed, and FIG. 5C is a cross-sectional view illustrating a schematic configuration of the vicinity of the division line DL at the time of singulating the organic EL substrate 2 when the sealing film 30 is formed using the CVD mask so as to be separated from the division line DL.

As illustrated in FIGS. 5A and 5B, in a case that the inorganic sealing film such as the first inorganic layer 31 and the second inorganic layer 33 is present on the division line DL, a crack CR may be generated in the inorganic sealing film on the division line DL as a result of the inorganic sealing film being cut.

At this time, as illustrated in FIG. 5B, if the eaves body 41 is not formed facing the edge portion of the organic EL substrate 2 to be divided along the division line DL, the crack CR generated in the inorganic sealing film may spread through the inorganic sealing film, and may spread into the display region 5 of the divided organic EL substrate 2.

However, according to the present embodiment, since the eaves body 41 is provided along the division line DL on which the inorganic sealing film is formed, at the time of forming the inorganic sealing film, the inorganic sealing film is naturally split apart at the boundaries with the wall surfaces of the eaves body 41, below the protruding portions 41a of the eaves body 41, along the wall surfaces, as described above.

Thus, according to the present embodiment, as illustrated in FIG. 5A, the split portions 31a of the first inorganic layer 31 and the split portions 33a of the second inorganic layer 33, which face the wall surfaces of the eaves body 41, are provided in the first inorganic layer 31 and the second inorganic layer 33. Thus, even in a case that the crack CR is generated in the sealing film 30 on the division line DL as a result of the sealing film 30 being cut, since the first inorganic layer 31 and the second inorganic layer 33 are split apart by the split portions 31a and 33a, spread of the crack CR is stopped at the split portions 31a and 33a. Thus, according to the present embodiment, the crack CR generated in the inorganic sealing film does not spread into the display region 5, and moisture or oxygen does not penetrate into the display region 5. Thus, the highly reliable organic EL display device 1 can be formed.

Note that in a case that the sealing film 30 in each of the organic EL substrates 2 is formed independently using a mask such that the sealing films 30 of the adjacent organic EL substrates 2 on the mother substrate 50 do not come in contact with each other, as illustrated in FIG. 5C, the inorganic sealing film is not present on the division line DL, and the crack CR is never generated in the inorganic sealing film.

However, in a case that the inorganic sealing layer is formed using a mask, a shadow is generated on an edge portion of the inorganic sealing layer, as illustrated in FIG. 5C.

At this time, a region on which the shadow is generated (a shadow region P) is approximately from 300 to 400 µm. Since the film thickness of the inorganic sealing film decreases in the shadow region P, barrier properties are reduced therein. For this reason, the edge portion of the inorganic sealing layer needs to be sufficiently separated from the display region 5 by a distance including the machining accuracy and alignment accuracy of the mask so that the shadow is not present in the display region 5. Thus, in a case that the division line DL and the region in which the sealing film 30 is formed are separated using the mask, frame narrowing becomes impossible.

In contrast, according to the present embodiment, the shadow region P can be eliminated, so there is no such limitation. According to the present embodiment, since the inorganic sealing film can be provided on the division line DL, a margin for the forming accuracy of the inorganic sealing film can be secured. According to the present embodiment, since there is no need to separately dispose the edge portion of the inorganic sealing film and the divided region, the frame narrowing can be performed.

Note that in FIGS. 5A to 5C, although the position of the division line DL is aligned, the frame narrowing can be easily performed as long as the eaves body 41 is disposed in a position closer to the display region 5. The eaves body 41 can be formed very slightly inside the division line DL (in other words, very slightly inside the edge portion 2a of the organic EL substrate 2).

Furthermore, although not illustrated, in a case that a groove is formed on the division line DL by removing the inorganic sealing film on the division line DL after forming the sealing film 30, photolithography using a photoresist, etching, and peeling steps are required after forming the sealing film 30, and these steps need to be performed in a low temperature process so as not to damage the organic EL element 24. Therefore, in a case that the groove is formed on the division line DL as described above, not only is an extra burden added in terms of equipment costs and running costs, but also yield decreases due to the increased number of steps.

In contrast, according to the present embodiment, since only the photolithography step for forming the eaves body 41 is required to be added, the burden of adding the number of steps is relatively low. In addition, by forming the eaves body 41 before the film forming step of the sealing film 30, particularly before the film forming step of the organic EL layer 22, material loss in a case that a pattern failure of the eaves body 41 occurs can be significantly reduced.

First Modified Example

FIGS. 6A and 6B are cross-sectional views illustrating manufacturing steps of main portions of the organic EL display device 1 according to a modified example in order of the steps.

In FIG. 1 to FIG. 5A, a case is described, as an example, in which the eaves body 41 facing the division line DL is formed on the inner side of the division line DL.

However, the present embodiment is not limited to this example, and as illustrated in FIG. 6A, the eaves body 41 may be formed on the division line DL.

In a case in which the eaves body 41 is formed on the division line DL and the mother substrate 50 is divided, the eaves body 41 is divided along the division line DL.

As a result, as illustrated in FIG. 6B, the organic EL display device 1 according to the present modified example has a configuration in which an eaves body 41A, which is formed by the eaves body 41 being divided, is provided facing the edge portion 2a, such that a portion of the eaves body 41A is positioned on the edge portion 2a of the organic EL substrate 2.

More specifically, in the organic EL display device 1 according to the present modified example, the eaves body 41A is provided on at least a portion of the edge portion 2a of the organic EL substrate 2, such that an end face of the organic EL substrate 2 along the edge portion 2a and one end face of the eaves body 41A formed by the eaves body 41 being divided are provided so as to be flush with each other.

In the present modified example as well, the first inorganic layer 31 and the second inorganic layer 33, which are the inorganic sealing film, are naturally split apart along the wall surfaces of the eaves body 41 at the boundaries with the wall surfaces below the protruding portions 41a of the eaves body 41, when forming these inorganic sealing films.

Therefore, in the present modified example as well, the split portion 31a of the first inorganic layer 31 and the split portion 33a of the second inorganic layer 33, which face and conform to the wall surface of the eaves body 41A, are formed below the protruding portion 41a of the eaves body 41A formed by the eaves body 41 being divided.

Therefore, in the present modified example as well, the spread of the crack is stopped at the split portions 31a and 33a, and thus, the highly reliable organic EL display device 1 can be formed. In addition, according to the present modified example, by forming the eaves body 41 on the division line DL, the frame narrowing can be achieved to a further extent than in a case in which the eaves body 41 is formed on the inner side of the division line DL.

Second Modified Example

Figure 7A:
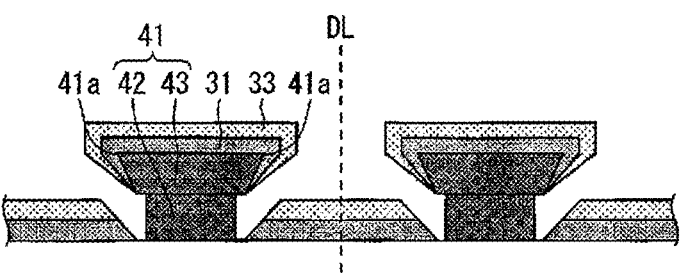
FIGS. 7A and 7B are each a cross-sectional view illustrating an example of a shape of an eaves body according to a second modified example of the first embodiment of the disclosure.
Figure 7B:
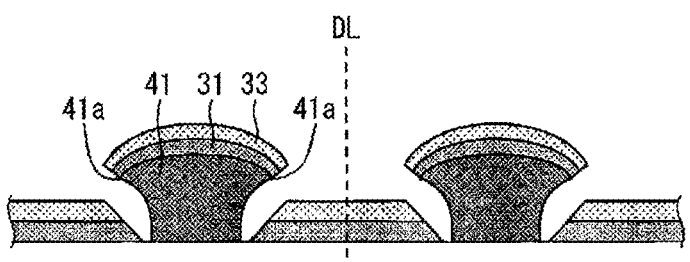

FIGS. 7A and 7B are each a cross-sectional view illustrating an example of the shape of the eaves body 41 according to the present modified example.

As illustrated in FIG. 1 and the like, in the present embodiment, a case is illustrated, as an example, in which the eaves body 41 has a trapezoidal reversely tapered shape in a cross-sectional view. However, the present embodiment is not limited to this example, and the eaves body 41 may be the eaves body 41 having a T-shape in which an upper step portion 43 is layered on a lower step portion 42, as illustrated in FIG. 7A. In addition, as illustrated in FIG. 7B, the eaves body 41 may have a reversely tapered shape in which the upper surface and side surfaces thereof have a curved shape.

Similarly to the eaves body 41 illustrated in FIG. 1 and the like, the eaves body 41 illustrated in FIGS. 7A and 7B also includes the protruding portion 41a (the eaves portion) on each of the edge portions of the eaves body 41 along each of the edge portions 2a of the organic EL substrate 2.

Note that although it is preferable that the eaves body 41 be all formed from a resin material such as the permanent film photoresist, a material other than the resin may be used. In addition, in the eaves body 41 illustrated in FIG. 7A, different resins may be used for the lower step portion 42 and the upper step portion 43, or a material other than the resin may be used for one of the portions.

Third Modified Example

In the present embodiment, a case is described, as an example, in which the sealing film 30 includes the first inorganic layer 31 and the second inorganic layer 33, and the first inorganic layer 31 and the second inorganic layer 33 are layered on the edge portion 2a of the organic EL substrate 2 (in other words, on the division line DL) and on the protruding portions 41a of the eaves body 41.

However, the present embodiment is not limited to this example, and may have a configuration in which only one of the inorganic layers of the first inorganic layer 31 and the second inorganic layer 33 is formed on the edge portion 2a of the organic EL substrate 2 and on the protruding portions 41a of the eaves body 41.

Fourth Modified Example

An object of the disclosure is to prevent the crack generated in the sealing film 30 from spreading into the display region 5, as described above, and in FIG. 1, a case is illustrated, as an example, in which the inorganic films, such as the gate insulating film 14 and the inorganic insulating film 15 (the passivation film) that are formed in the TFT step are formed on the edge portion 2a of the organic EL substrate 2 (in other words, on the division line DL). Since these inorganic films are typically formed by plasma CVD using a higher temperature than that for the inorganic sealing film, these inorganic films have strong crack resistance properties.

However, the present embodiment is not limited to this example. To prevent cracks from occurring in these inorganic films formed at the TFT step, these inorganic films on the division line DL may be removed by photolithography, etching, or the like at a step for forming the inorganic films.

Figure 8:
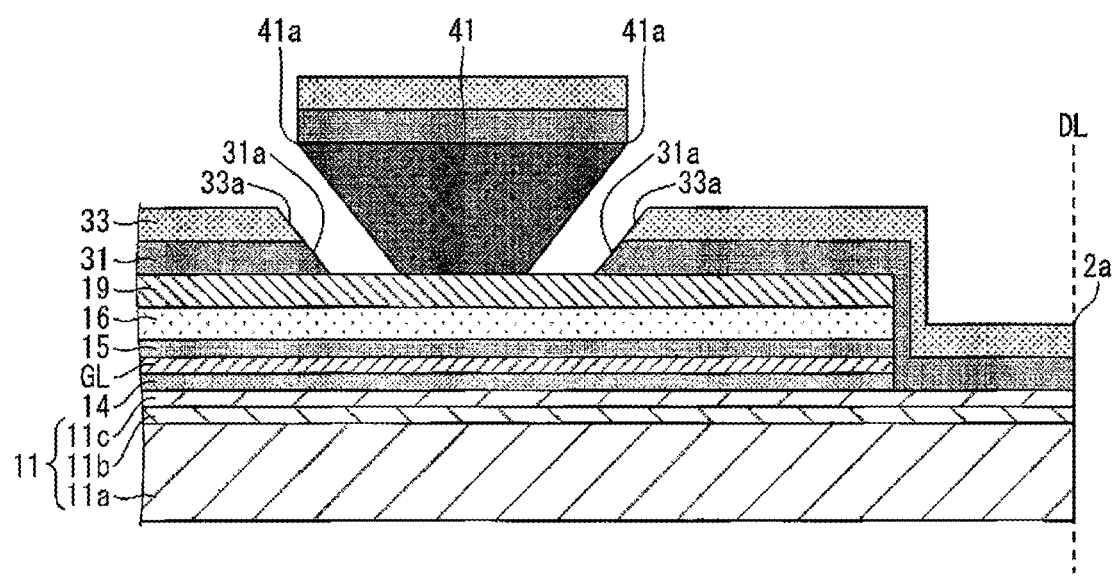
FIG. 8 is a cross-sectional view illustrating an example of a schematic configuration of main portions of an organic EL display device according to a fourth modified example of the first embodiment of the disclosure.

FIG. 8 is a cross-sectional view illustrating an example of a schematic configuration of main portions of the organic EL display device 1 according to the present modified example, when the organic EL display device 1 is divided along the division line DL.

Note that in FIG. 8, a case is illustrated, as an example, in which the organic EL display device 1 is the flexible display device.

FIG. 8 illustrates the organic EL display device 1 in which, after peeling off the carrier substrate of the mother substrate 50, and then, bonding a lower face film 11a to the peeling surface, the mother substrate 50 is divided and singulated along the division lines DL.

The organic EL display device 1 illustrated in FIG. 8 has a configuration in which, below the eaves body 41, the support body 11 formed by the lower face film 11a, a resin layer 11b, and a barrier layer 11c (a moisture-proof layer), the gate insulating film 14, gate wiring lines GL (specifically, lead-out wiring lines of the gate wiring lines GL), the inorganic insulating film 15 (the first passivation film) covering the gate electrodes G and the like and covering the gate wiring lines GL, the inorganic insulating film 16 (the second passivation film) covering the auxiliary capacitance electrodes C and the like, and the inorganic insulating film 19 (the third passivation film) covering the source wiring lines and the like are layered in this order from the lower face film 11a side.

As illustrated in FIG. 8, the organic EL display device 1 may have a configuration in which, before the film forming step of the first inorganic layer 31 and the second inorganic layer 33, inorganic layers other than the barrier layer 11c on the division line DL are removed, and only the first inorganic layer 31 and the second inorganic layer 33 are layered on the division line DL, as the inorganic layers other than the barrier layer 11c of the support body 11.

Fifth Modified Example

As described above, in the present embodiment, as an example of the display device according to the present embodiment, the organic EL display device 1 including the organic EL elements 24 (the OLED elements) as the light emitting elements is described as an example. However, the present embodiment is not limited to this example, and the light emitting elements may be inorganic EL elements or Quantum-dot Light Emitting Diode (QLED) elements.

Second Embodiment

A description follows regarding another embodiment of the disclosure mainly with reference to FIG. 9 to FIGS. 11A to 11C. The present embodiment will be described in terms of the differences between the present embodiment and the first embodiment, and components having the same function as the components described in the first embodiment are assigned the same reference signs, and a description thereof is omitted. Furthermore, the same modifications as those of the first embodiment can also be applied to the present embodiment.

Figure 9:
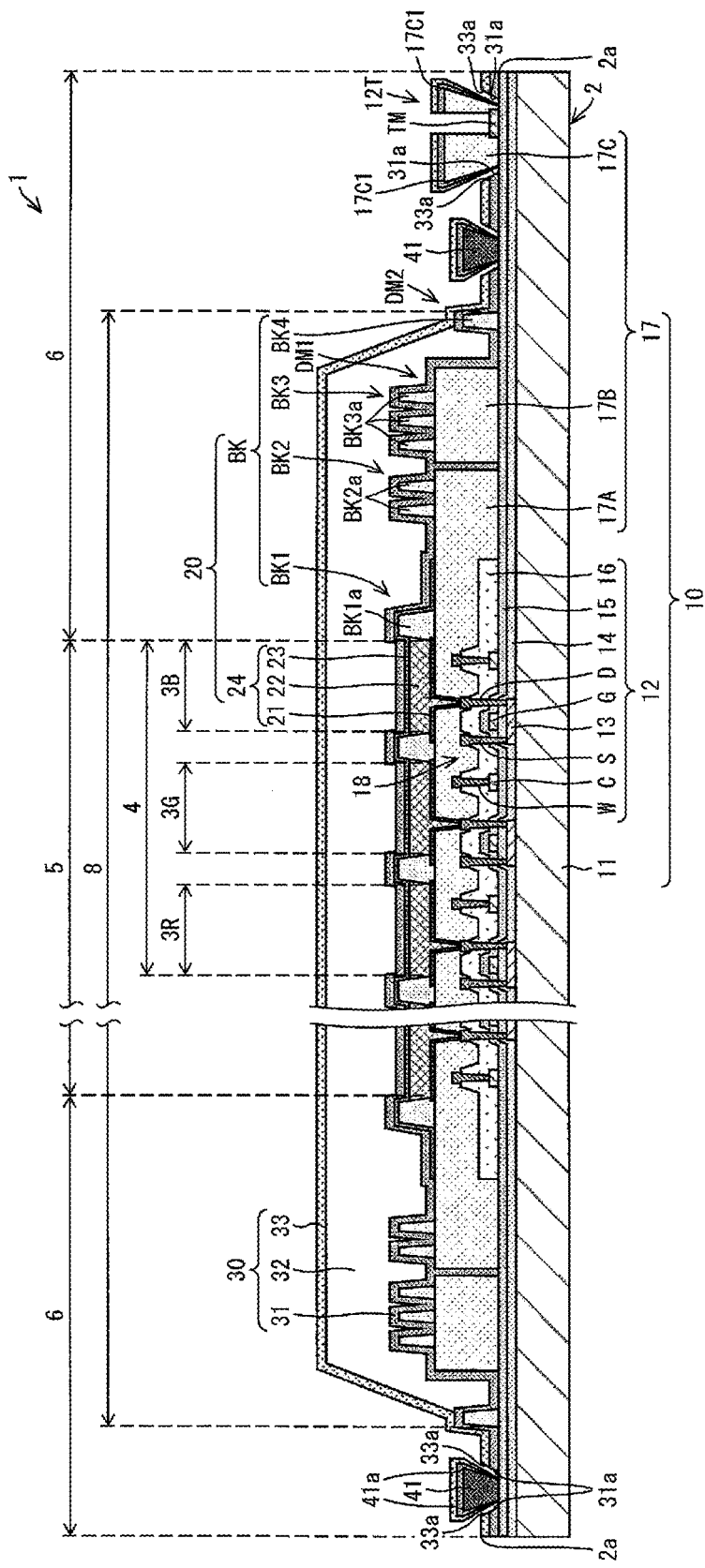
FIG. 9 is a cross-sectional view illustrating an example of a schematic configuration of an organic EL display device according to a second embodiment of the disclosure.
Figure 10:
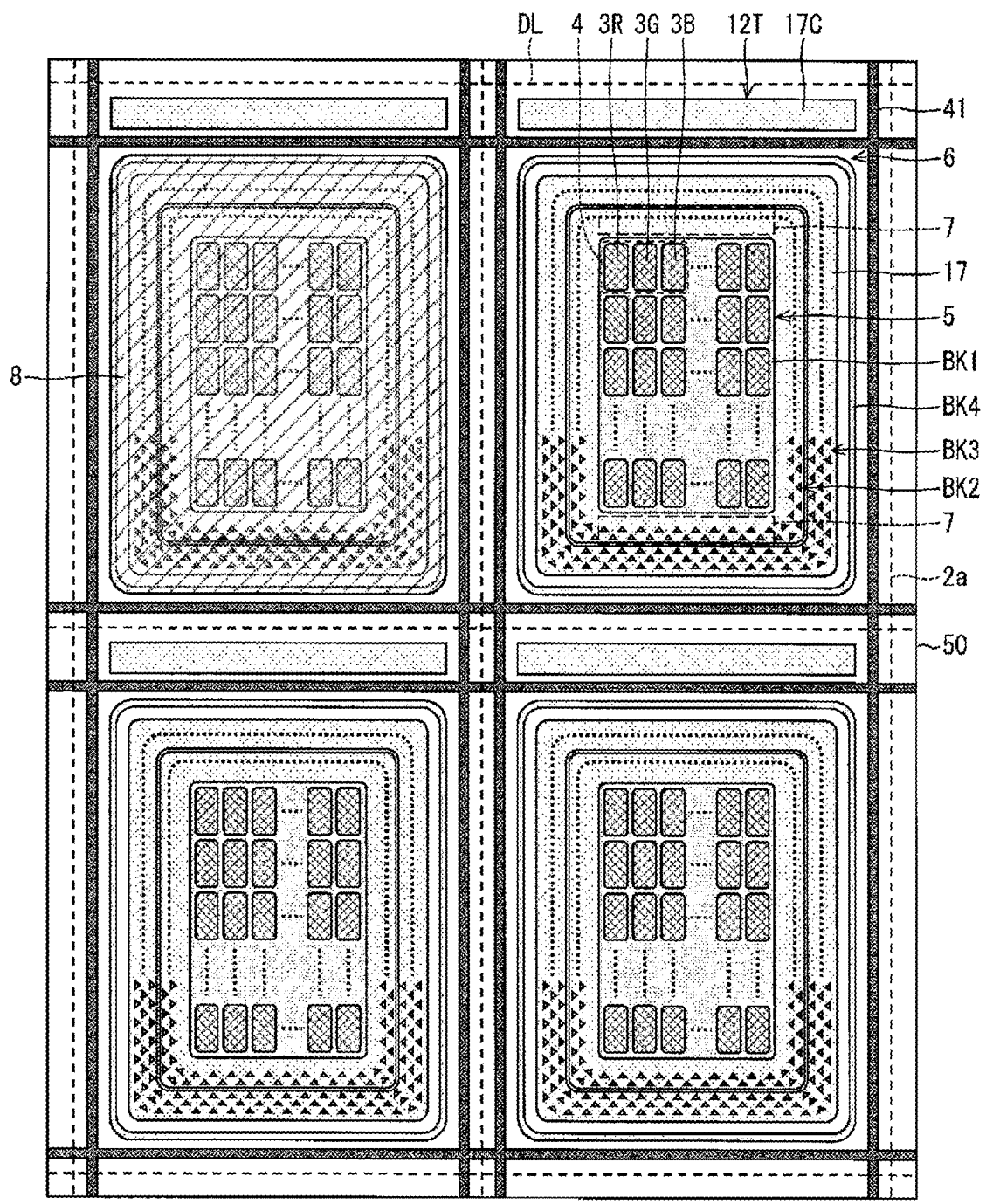
FIG. 10 is a plan view illustrating a schematic configuration of main portions of an organic EL substrate of an organic EL display device according to the second embodiment of the disclosure, before performing a step of exposing terminals of a terminal portion.
Figure 11A:
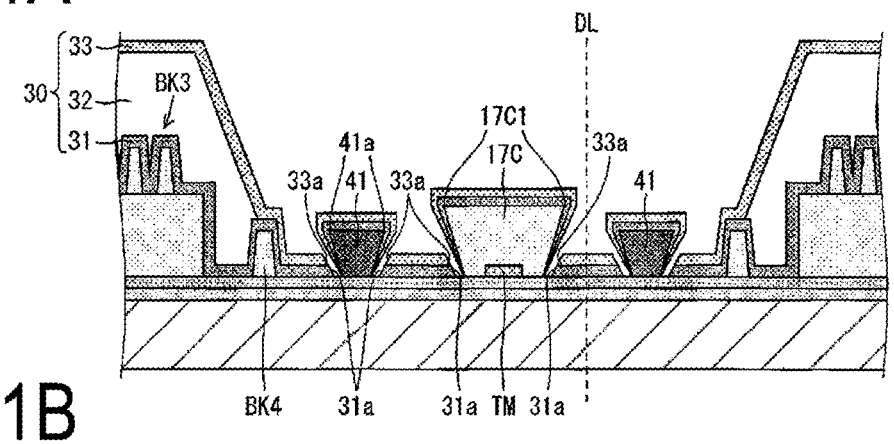
FIGS. 11A to 11C are cross-sectional views illustrating manufacturing steps of main portions of an organic EL display device according to the second embodiment of the disclosure in order of the steps.
Figure 11B:
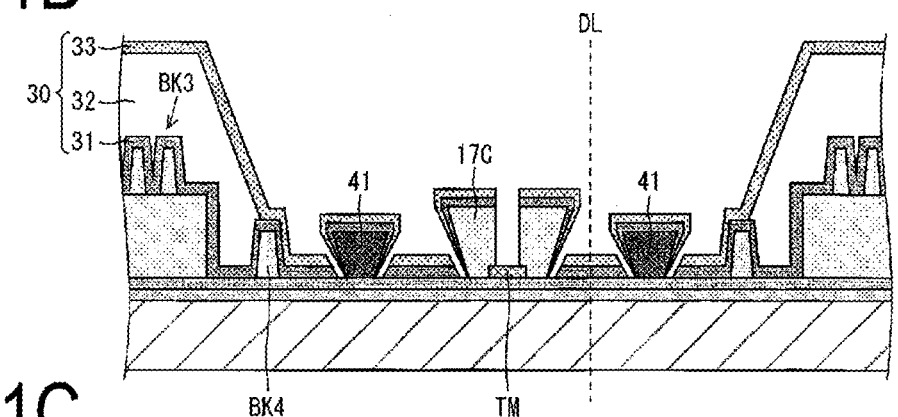
Figure 11C:
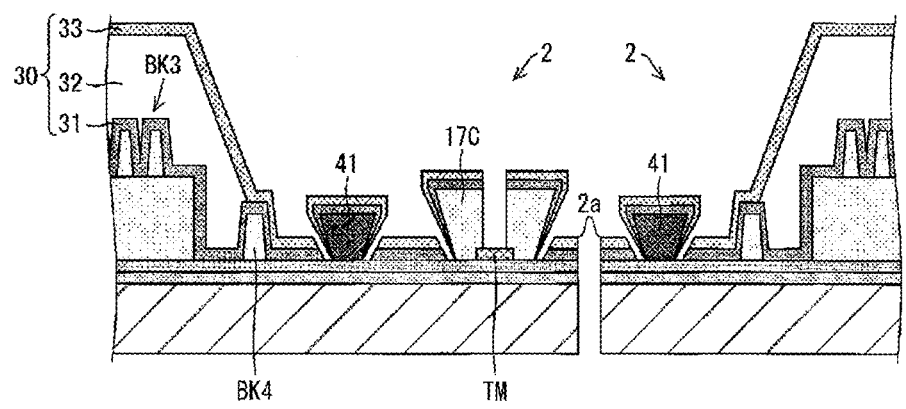

FIG. 9 is a cross-sectional view illustrating an example of a schematic configuration of the organic EL display device 1 according to the present embodiment. FIG. 10 is a plan view illustrating a schematic configuration of main portions of the organic EL substrate 2 of the organic EL display device 1 before performing a terminal exposing step of the terminal portion 12T. Furthermore, FIGS. 11A to 11C are cross-sectional views illustrating manufacturing steps of main portions of the organic EL display device 1 according to the present embodiment in order of the steps.

A method for manufacturing the organic EL display device 1 according to the present embodiment differs from the method for manufacturing the organic EL display device 1 according to the first embodiment with respect to a point in which the inorganic sealing film is formed in a maskless manner.

In the present embodiment, steps up to forming, on the inorganic insulating film 16, the plurality of source electrodes S, the plurality of drain electrodes D, the plurality of auxiliary capacitance wiring lines W, the plurality of source wiring lines (not illustrated), the plurality of power source lines (not illustrated), and the terminal portion 12T including the plurality of terminals TM are the same as those of the first embodiment.

After that, in the present embodiment, in the same manner as in the first embodiment, a photosensitive resin, such as an acrylic resin or a polyimide resin, is applied to the mother substrate 50 on which the wiring lines and the like are formed, and patterning is performed by photolithography or the like, thus forming the organic insulating film 17 including the first organic insulating film pattern portion 17A to the third organic insulating film pattern portion 17C.

However, in the present embodiment, as illustrated in FIG. 10 and FIG. 11A, the third organic insulating film pattern portion 17C is formed covering the terminals TM in the terminal portion 12T. At this time, in the present embodiment, for example, the third organic insulating film pattern portion 17C, which has a reversely tapered shape in a cross-sectional view and includes protruding portions 17C1 (eaves portions) protruding in the in-plane direction, is formed above the surface of the TFT substrate 10 on the TFT substrate 10 for which the mother substrate 50 serves as the support body. In this way, the mother substrate 50, on which the TFT layer 12 is formed, is formed as the TFT substrate 10.

After that, in the same manner as in the first embodiment, after the first electrode 21 is pattern formed in the matrix shape, the banks BK1 to BK4 are formed.

Next, in the same manner as in the first embodiment, the reversely tapered eaves body 41 is pattern formed by photolithography or the like on the TFT substrate 10 along the division line DL. At this time, in the present embodiment, as illustrated in FIG. 10 and FIG. 11A, the eaves body 41 is further formed between the display region 5 and the terminal portion 12T inside a region surrounded by the division lines DL. Specifically, in a plan view, along the plurality of terminal portions 12T adjacent to each other with the division line DL interposed therebetween, the eaves body 41 is formed in a line shape in a plan view between these terminal portions 12T and the display regions 5.

After that, in the same manner as in the first embodiment, the organic EL layer 22 and the second electrode 23 are formed, and an electrical connection is made between the second electrode 23 and the second electrode connecting portion 7. In this way, the organic EL element 24 formed by the first electrode 21, the organic EL layer 22, and the second electrode 23 is formed on the TFT substrate 10.

Next, without using the mask that is used in the first embodiment, the first inorganic layer 31 is formed, on the TFT substrate 10 on which the organic EL elements 24 are formed, over the whole surface of the mother substrate 50 in a maskless manner, such that the protruding portions 41a of the eaves body 41 and each division line DL are covered by the first inorganic layer 31.

Next, after forming the organic layer 32 in the same manner as in the first embodiment, the second inorganic layer 33 is formed on the first inorganic layer 31 in a maskless manner in the same manner as the first inorganic layer 31 such that the organic layer 32 is sealed by the first inorganic layer 31 and the second inorganic layer 33. As a result, the sealing film 30 formed by the first inorganic layer 31, the organic layer 32, and the second inorganic layer 33 is formed.

At this time, in the present embodiment as well, the split portions 31a of the first inorganic layer 31 and the split portions 33a of the second inorganic layer 33, which face and conform to the wall surfaces of the eaves body 41, are formed below the protruding portions 41a of the eaves body 41.

Further, at this time, as described above, by forming the third organic insulating film pattern portion 17C, which covers the terminal portion 12T, in the reversely tapered shape including the protruding portions 17C1 in a cross-sectional view, the split portions 31a of the first inorganic layer 31 and the split portions 33a of the second inorganic layer 33, which face and conform to the wall surfaces of the third organic insulating film pattern portion 17C, are also formed below the protruding portions 17C1.

After that, as illustrated in FIG. 11B, by irradiating the terminal portion 12T with a laser, the terminal exposing step is performed to expose the terminals TM of the terminal portion 12T.

Next, as in the first embodiment, after bonding the protection film or the like (not illustrated) onto the sealing film 30, by dividing (dicing) the mother substrate 50, on which the TFT layer 12, the OLED layer 20, the eaves body 41, and the sealing film 30 are formed, along the division line DL such that the first inorganic layer 31 and the second inorganic layer 33 are divided around each of the display regions 5 of the mother substrate 50, the singulation of the organic EL substrate 2 is performed as illustrated in FIG. 11C.

After that, as necessary, a function film, such as a polarizing film and a touch sensor film, or a polarizer, a touch panel or the like, is bonded to the organic EL substrate 2.

As a result, as illustrated in FIG. 9, the organic EL display device 1 can be formed in a manner in which the eaves body 41 is provided, for example, along the edge portion 2a of the organic EL substrate 2 on each of the sides of the organic EL substrate 2 apart from the side facing the terminal portion 12T, the eaves body 41 is further provided along the terminal portion 12T between the display region 5 and the terminal portion 12T, and at least below the protruding portions 41*a* of each of the eaves bodies 41, the split portions 31*a* of the first inorganic layer 31 and the split portions 33*a* of the second inorganic layer 33, which face and conform to the wall surfaces of the eaves body 41, are provided.

According to the present embodiment, by the first inorganic layer 31 and the second inorganic layer 33 respectively including the split portions 31*a* and 33*a*, the same effects as those of the first embodiment can be obtained.

In addition, according to the present embodiment, the CVD mask is not necessary, and the frame narrowing and cost reduction can be achieved to a further extent than in the first embodiment.

Note that, as described above, in the organic EL display device 1 according to the present embodiment, edge portions of the terminals TM in the terminal portion 12T are covered by the third organic insulating film pattern portion 17C, and the third organic insulating film pattern portion 17C includes the protruding portions 17C1, which protrude in the in-plane direction above the surface of the TFT substrate 10 and which are disposed on edge portions of the third organic insulating film pattern portion 17C along the edge portion 2*a* of the organic EL substrate 2 that faces the terminal portion 12T. Accordingly, the split portions 31*a* of the first inorganic layer 31 and the split portions 33*a* of the second inorganic layer 33 are provided also below each of the protruding portions 17C1, as described above.

However, the present embodiment is not limited to this example, and the third organic insulating film pattern portion 17C may be formed so as to have a shape that does not include the protruding portions 17C1 (a rectangular shape in a cross-sectional view, for example).

Third Embodiment

Figure 12A:
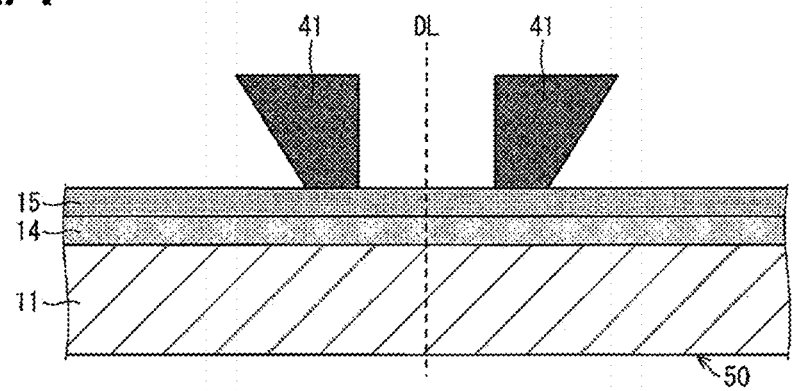
FIGS. 12A to 12C are cross-sectional views illustrating manufacturing steps of main portions of an organic EL display device according to a third embodiment of the disclosure in order of the steps.
Figure 12B:
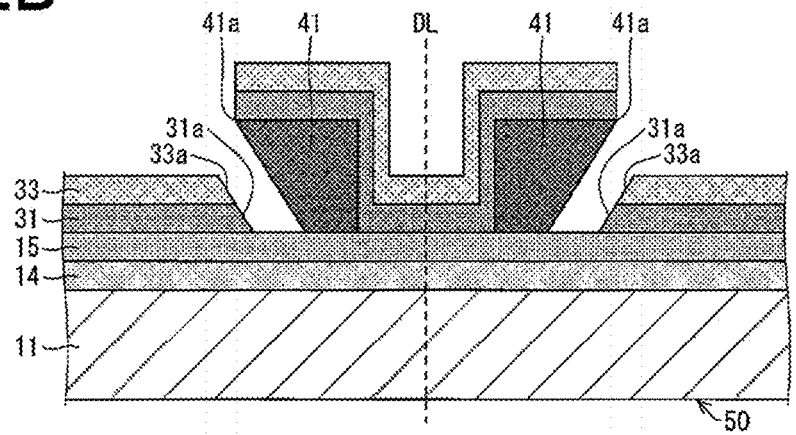
Figure 12C:
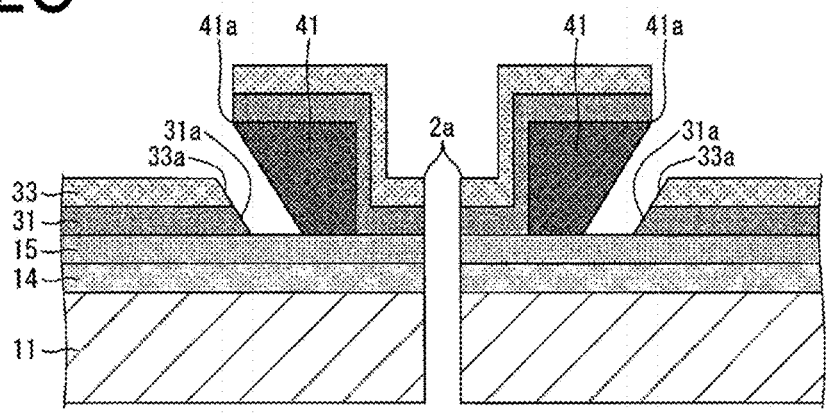

A description follows regarding yet another embodiment of the disclosure mainly with reference to FIGS. 12A to 12C. Note that the present embodiment will be described in terms of the differences between the present embodiment and the first and second embodiments, and components having the same function as the components described in the first embodiment are assigned the same reference signs, and a description thereof will be omitted. Furthermore, the same modifications as those of the first and second embodiments can also be applied to the present embodiment.

FIGS. 12A to 12C are cross-sectional views illustrating manufacturing steps of main portions of the organic EL display device 1 according to the present embodiment in order of the steps.

In the first and second embodiments, a case is described, as an example, in which the eaves body 41 has the reversely tapered shape, the T-shape (an overhang shape), or the like in a cross-sectional view, and the eaves body 41 includes the protruding portion 41*a* on each of the edge portions of the eaves body 41 along the edge portion of the division line DL in a plan view.

However, the shape of the eaves body 41 is not limited to the above-described shapes, and the eaves body 41 may include the protruding portion 41*a* only on one of the edge portions of the eaves body 41 along the edge portion of the division line DL in a plan view.

In a case that the protruding portion 41*a* is provided on at least one of the edge portions of the eaves body 41, the split portion 31*a* of the first inorganic layer 31 and the split portion 33*a* of the second inorganic layer 33 are formed below the protruding portion 41*a* along the wall surface of the eaves body 41. Thus, the protruding portion 41*a* may be provided on only one of the edge portions of the eaves body 41.

For example, as illustrated in FIGS. 12A to 12C, in a case that the eaves body 41 is disposed inside the division line DL (in other words, on the display region 5 side of the division line DL) so as to be separated from the division line DL, the protruding portion 41*a* may be provided only on the inner edge portion of the eaves body 41 (in other words, the edge portion closer to the display region 5, which is opposite to the edge portion closer to the division line DL) of the edge portions of the eaves body 41.

FIGS. 12A to 12C illustrate a case, as an example, in which the eaves body 41 has a quadrilateral (trapezoidal) shape in a cross-sectional view obtained by dividing the eaves body 41 having the reversely tapered shape as illustrated in FIG. 1 and the like, for example, into two parts along the division line DL, and the protruding portion 41*a* is provided only on the inner edge portion of the edge portions of the eaves body 41.

The organic EL display device 1 according to the present embodiment is the same as the organic EL display device 1 according to the first and second embodiments, excepting that the shape of the eaves body 41 is different, as described above. Thus, the organic EL display device 1 according to the present embodiment can be manufactured by the same method as the method for manufacturing the organic EL display device 1 according to the first and second embodiments, apart from changing the shape of the eaves body 41.

Note that this type of eaves body 41 can be formed by combining photolithography and laser irradiation, for example.

In the present embodiment, as illustrated in FIG. 12A, after disposing the eaves bodies 41 each having the protruding portion 41*a* only on the inner edge portion thereof such that the eaves bodies 41 are linearly symmetrical with the division line DL interposed therebetween, the organic EL layer 22, the second electrode 23, the first inorganic layer 31, the organic layer 32, and the second inorganic layer 33 are formed in the same manner as in the first and second embodiments.

In the present embodiment, as illustrated in FIG. 12B, since the protruding portion 41*a* is not formed on the edge portion on the outer side (in other words, on the divided line DL side) of the eaves body 41, the split portions 31*a* and 33*a* are not formed between the eaves bodies 41 adjacent to each other with the division line DL interposed therebetween. Thus, the inorganic sealing films (the first inorganic layer 31 and the second inorganic layer 33) that cover the division line DL are formed across the eaves bodies 41 adjacent to each other with the division line DL interposed therebetween, and at the same time, below the protruding portions 41*a* provided on the inner edge portions of the eaves bodies 41, the inorganic sealing films are split apart along the wall surfaces of the eaves bodies 41.

As a result, in the present embodiment, by dividing the mother substrate 50 along the division line DL, as illustrated in FIG. 12C, the organic EL display device 1 can be obtained in which the inorganic sealing films are provided continuously from the edge portion 2*a* of the organic EL substrate 2 to the top surface of the eaves body 41, and the inorganic sealing films are separated from the inorganic sealing films provided on the inner side of the eaves body 41 below the protruding portion 41*a*.

Except for the first modified example of the first embodiment, the organic EL display device 1 according to the first and second embodiments has a configuration in which two of the line-shaped split portions 31a and 33a extending parallel to each other with the eaves body 41 interposed therebetween are provided on the inner side of the edge portion 2a of the organic EL substrate 2, for example. In contrast, the organic EL display device 1 according to the present embodiment has a configuration in which, similarly to the first modified example of the first embodiment, one line of the line-shaped split portions 31a and 33a is provided along the eaves body 41 between the edge portion 2a of the organic EL substrate 2 and the display region 5.

Note that in FIGS. 12A to 12C, a case is illustrated, as an example, in which, as described above, the eaves body 41 has the quadrilateral shape in a cross-sectional view, which is obtained by dividing the eaves body 41 having the reversely tapered shape as illustrated in FIG. 1 and the like, for example, into two parts along the division line DL. However, the present embodiment is not limited to this example. For example, the eaves body 41 may have a shape obtained by dividing the eaves body 41 illustrated in FIGS. 7A and 7B into two parts along the division line DL.

In FIGS. 12A to 12C, a case is illustrated, as an example, in which the gate insulating film 14 and the inorganic insulating film 15 are provided on the division line DL. However, in the present embodiment as well, as illustrated in FIG. 8, the inorganic layers other than the barrier layer 11c may be removed on the division line DL.

Supplement

A display device (the organic EL display device 1) according to a first aspect of the disclosure includes a support body (the TFT substrate 10), a plurality of light emitting elements (the organic EL elements 24) provided on the support body, and a sealing film (the sealing film 30) configured to seal the plurality of light emitting elements. The sealing film includes at least an inorganic layer (the first inorganic layer 31 and the second inorganic layer 33). The inorganic layer covers at least part of an edge portion of the support body (the edge portion 2a of the organic EL substrate 2 including the TFT substrate 10) in a plan view. An eaves body (the eaves body 41, 41A) including an eaves portion (the protruding portion 41a) is provided outside a display region (the display region 5) in which the plurality of light emitting elements are disposed and provided along the edge portion on which the inorganic layer is provided in a plan view. The eaves portion is provided protruding above the support body in a cross-sectional view, on at least one of edge portions of the eaves body along the edge portion of the support body. The inorganic layer covers the eaves portion and is split apart below the eaves portion facing a wall surface of the eaves body.

According to a second aspect of the disclosure, in the display device according to the first aspect, the eaves body may be formed of a resin.

According to a third aspect of the disclosure, in the display device according to the first or second aspect, the eaves body may be provided facing the edge portion of the support body on which the inorganic layer is provided.

According to a fourth aspect of the disclosure, in the display device according to any one of the first to third aspects, the eaves body may be provided, in a plan view, inside the edge portion of the support body on which the inorganic layer is provided and separated from the edge portion.

According to a fifth aspect of the disclosure, in the display device according to any one of the first to fourth aspects, the eaves body may have a reversely tapered shape in a cross-sectional view, and the eaves portion may be provided on each of the edge portions of the eaves body along the edge portion of the support body in a plan view.

According to a sixth aspect of the disclosure, in the display device according to any one of the first to fourth aspects, the eaves body may include, in a plan view, the eaves portion on only an edge portion closer to the display region, of the edge portions of the eaves body along the edge portion of the support body.

According to a seventh aspect of the disclosure, in the display device according to any one of the first to sixth aspects, the display region 5 may include a plurality of subpixels (the plurality of subpixels 3), the plurality of light emitting elements may each include a first electrode (the first electrode 21), a function layer (the organic EL layer 22) including a light emitting layer, and a second electrode (the second electrode 23), the first electrode 21, the function layer, and the second electrode 23 being layered in this order. At least the first electrode 21 may be provided for each of the plurality of subpixels 3. A second electrode connecting portion (the second electrode connecting portion 7) electrically connected to the second electrode 23 may be provided outside the display region 5. The eaves body may be provided outside the second electrode connecting portion 7 in a plan view.

According to an eighth aspect of the disclosure, in the display device according to any one of the first to seventh aspects, the sealing film 30 may include a first inorganic layer (the first inorganic layer 31), a second inorganic layer (the second inorganic layer 33), and an organic layer (the organic layer 32) sealed between the first inorganic layer 31 and the second inorganic layer 33 and covering the display region 5, and the eaves body may be provided outside an edge portion of the organic layer 32 (in other words, outside a sealing region (the sealing region 8)).

According to a ninth aspect of the disclosure, in the display device according to any one of the first to eighth aspects, the support body may have a quadrilateral shape in a plan view, a terminal portion (the terminal portion 12T) may be provided between at least part of a side of four sides of the support body and the display region 5, along the at least one side, and the eaves body may face at least an edge portion of the support body located on a side on which the terminal portion 12T is not provided.

According to a tenth aspect of the disclosure, in the display device according to the ninth aspect, the eaves body may be further provided between the display region 5 and the terminal portion 12T in a plan view.

According to an eleventh aspect of the disclosure, in the display device according to any one of the first to fourth aspects, the eaves body may be provided on at least part of the edge portion of the support body with an end face of the support body and one end face of the eaves body, along the part of the edge portion, flush with each other, and the eaves portion may be provided only on an edge portion closer to the display region located inside the edge portion of the support body, of the edge portions of the eaves body along the edge portion of the support body in a plan view.

According to a twelfth aspect of the disclosure, in the display device according to any one of the first to eleventh aspects, the eaves body may have a height at least twice a height of the inorganic layer on the eaves body.

According to a thirteenth aspect of the disclosure, in the display device according to any one of the first to twelfth aspects, the eaves body may have a height of at least 1 µm.

According to a fourteenth aspect of the disclosure, in the display device according to any one of the first to twelfth aspects, the eaves body may have a height of at least 4 µm.

According to a fifteenth aspect of the disclosure, in the display device according to any one of the first to fourteenth aspects, the eaves body may have a width at least 1.5 times the height of the eaves body.

A method for manufacturing a display device (an organic EL display device 1) according to a sixteenth aspect of the disclosure is a method for manufacturing a display device including a support body (the TFT substrate 10), a plurality of light emitting elements (the organic EL elements 24) provided on the support body, and a sealing film (the sealing film 30) configured to seal the plurality of light emitting elements. The method includes: forming the plurality of light emitting elements on a mother substrate (the mother substrate 50) configuring at least part of the support body such that a plurality of display regions 5 (the plurality of display regions 5), on which the plurality of light emitting elements are disposed, are formed corresponding to each of the display devices; forming an eaves body (the eaves body 41, 41A) including an eaves portion (the protruding portion 41a) along a scheduled division line (the division line DL) on which the mother substrate 50 is divided and singulated into individual display devices in a plan view, the eave portion being provided on at least one edge portion of edge portions along the scheduled division line and protruding in an in-plane direction above the support body in a cross-sectional view; forming the sealing film 30; and dividing the mother substrate 50 on which the sealing film 30 is formed along the scheduled division line around each of the plurality of display regions 5. The forming the sealing film includes forming an inorganic layer (the first inorganic layer 31 and the second inorganic layer 33), and in the forming an inorganic layer, the inorganic layer is formed such that the inorganic layer covers the eaves portion and covers the scheduled division line along the edge portion of the eaves body in a plan view, and the inorganic layer is split apart below the eaves portion facing a wall surface of the eaves body.

According to a seventeenth aspect of the disclosure, in the method for manufacturing a display device according to the sixteenth aspect, in the forming an eaves body, the eaves body may be formed facing a part of the scheduled division line.

According to an eighteenth aspect of the disclosure, in the method for manufacturing a display device according to the sixteenth or seventeenth aspect, in the forming an eaves body, the eaves body may be formed inside a region surrounded by the scheduled division line on the mother substrate 50 in a plan view, while separated from the scheduled division line.

According to a nineteenth aspect of the disclosure, in the manufacturing method of a display device according to any one of the sixteenth to eighteenth aspects, in the dividing the mother substrate 50, the mother substrate 50 may be divided into parts having a quadrilateral shape in a plan view along the scheduled division line, and before the forming an eaves body, the method further includes forming a terminal portion (the terminal portion 12T) along a part of the scheduled division line corresponding to each of four sides of a region of the quadrilateral shape between the part of the scheduled division line and each of the plurality of display regions 5, in a plan view. In the forming an eaves body, the eaves body may be formed facing the scheduled division line of at least a side on which the terminal portion 12T is not provided, of the four sides of the region of the quadrilateral shape.

According to a twentieth aspect of the disclosure, in the manufacturing method of a display device according to the nineteenth aspect, in the forming an inorganic layer, the inorganic layer may be formed using a mask (the mask M) including a plurality of openings (the plurality of openings Ma) each opening a region surrounding the scheduled division line of a side on which the terminal portion 12T is not provided such that a line passing over each terminal TM of a plurality of adjacent the terminal portions 12T on either side of the scheduled division line is covered, and the scheduled division line of at least a side on which the terminal portion 12T is not provided, of the four sides of the region of the quadrilateral shape surrounded by the scheduled division line, is positioned inside each of the plurality of openings Ma.

According to a twenty first aspect of the disclosure, the method of manufacturing a display device according to the nineteenth aspect may further include covering, with a resin, the terminal portion 12T formed in the forming the terminal portion, and in the forming an eaves body, the eaves body may be further formed between each of the plurality of display regions 5 and the terminal portion 12T in the region of the quadrilateral shape. In the forming of the inorganic layer, the inorganic layer may be formed in a maskless manner over a whole surface of the mother substrate 50 such that the eaves portion of the eaves body and each of the scheduled division lines are covered by the inorganic layer, and, the method may further include, after the forming an inorganic layer, exposing the terminal TM of the terminal portion 12T.

According to a twenty second aspect of the disclosure, in the method for manufacturing a display device according to the twenty first aspect, the exposing a terminal may be performed by irradiating the terminal portion 12T with a laser.

According to a twenty third aspect of the disclosure, in the method for manufacturing a display device according to the sixteenth aspect, in the forming an eaves body, the eaves body may be formed on the scheduled division line in a plan view.

According to a twenty fourth aspect of the disclosure, in the method for manufacturing a display device according to any one of the sixteenth to twenty third aspects, in the forming an eaves body, the eaves body may have a reversely tapered shape in a cross-sectional view, and the eaves body may be formed such that the eaves portion is provided on each edge portion of the eaves body along an edge portion of the support body.

According to a twenty fifth aspect of the disclosure, in the method for manufacturing a display device according to any one of the sixteenth to twenty second aspects, in the forming an eaves body, the eaves body may be formed such that the eaves portion is provided only on an edge portion closer to the display region 5, of the edge portions of the eaves body along the scheduled division line in a plan view.

According to a twenty sixth aspect of the disclosure, in the method for manufacturing a display device according to any one of the sixteenth to twenty fifth aspects, the forming an eaves body may be performed during the forming the plurality of light emitting elements.

According to a twenty seventh aspect of the disclosure, in the method for manufacturing a display device according to any one of the sixteenth to twenty sixth aspects, the plurality of display regions 5 may each include a plurality of subpixels (the plurality of subpixels 3), the plurality of light emitting elements may each include a first electrode (the first electrode 21), a function layer (the organic EL layer 22) including a light emitting layer, and a second electrode (the second electrode 23), the first electrode 21, the function layer, and the second electrode 23 being layered in this order.

At least the first electrode 21 may be provided for each of the plurality of subpixels 3, and a peripheral edge portion of each first electrode 21 is covered by a bank (the bank BK1). The forming the plurality of light emitting elements may include forming the first electrode 21, forming the bank BK1, forming the function layer, and forming the second electrode 23. The forming the eaves body may be performed between the forming the bank and the forming the function layer, and the forming the sealing film may be performed after the forming the second electrode.

According to a twenty eighth aspect of the disclosure, in the method for manufacturing a display device according to any one of the sixteenth to twenty sixth aspects, the plurality of display regions 5 may each include a plurality of subpixels (the plurality of subpixels 3), the plurality of light emitting elements may each include a first electrode (the first electrode 21), a function layer (the organic EL layer 22) including a light emitting layer, and a second electrode (the second electrode 23), the first electrode 21, the function layer, and the second electrode 23 being layered in this order. At least the first electrode 21 may be provided for each of the plurality of subpixels 3, and a peripheral edge portion of each first electrode 21 is covered by a bank (the bank BK1). The forming the plurality of light emitting elements may include forming the first electrode 21, forming the bank BK1, forming the function layer, and forming the second electrode 23, and the forming an eaves body may be performed at the same time as the forming the bank using the same material as a material of the bank BK1.

The disclosure is not limited to each of the embodiments described above, and various modifications may be made within the scope of the claims. Embodiments obtained by appropriately combining technical approaches disclosed in each of the different embodiments also fall within the technical scope of the disclosure. Moreover, novel technical features can be formed by combining the technical approaches disclosed in the embodiments.

REFERENCE SIGNS LIST

1 Organic EL display device
2 Organic EL substrate
2a Edge portion
3, 3R, 3G, 3B Subpixel
4 Pixel
5 Display region
6 Frame region
7 Second electrode connecting portion
8 Sealing region
10 TFT substrate (support body)
12T Terminal portion
14 Gate insulating film
15, 16 Inorganic insulating film
17 Organic insulating film
17A First organic insulating film pattern portion
17B Second organic insulating film pattern portion
17C Third organic insulating film pattern portion
17C1, 41a Protruding portion (eaves portion)
21 First electrode
22 Organic EL layer (function layer)
23 Second electrode
24 Organic EL element (light emitting element)
30 Sealing film
31 First inorganic layer
31a, 33a Split portion
32 Organic layer
33 Second inorganic layer
41, 41A Eaves body
50 Mother substrate
BK, BK1, BK2, BK3, BK4 Bank
DL Division line (scheduled division line)
M Mask
Ma Openin

The invention claimed is:
1. A display device comprising:
a support body;
a plurality of light emitting elements provided on the support body; and
a sealing film configured to seal the plurality of light emitting elements,
wherein the sealing film includes at least an inorganic layer,
the inorganic layer covers at least part of an edge portion of the support body in a plan view,
an eaves body including an eaves portion is provided outside a display region of the support body in which the plurality of light emitting elements are disposed and provided along the edge portion on which the inorganic layer is provided in a plan view,
the eaves portion is provided protruding above the support body in a cross-sectional view, on at least one of edge portions of the eaves body along the edge portion of the support body,
the inorganic layer covers the eaves portion and is split apart below the eaves portion facing a wall surface of the eaves body,
the display region includes a plurality of subpixels,
the plurality of light emitting elements each includes a first electrode function layer including a light emitting layer, and a second electrode, the first electrode, the function layer, and the second electrode being layered in this order,
at least the first electrode is provided for each of the plurality of subpixels,
a second electrode connecting portion electrically connected to the second electrode is provided outside the display region, and
the eaves body is provided outside the second electrode connecting portion in a plan view.
2. The display device according to claim 1,
wherein the eaves body is formed of a resin.
3. The display device according to claim 1,
wherein the eaves body is provided facing the edge portion of the support body on which the inorganic layer is provided.
4. The display device according to claim 1,
wherein the eaves body is provided, in a plan view, inside the edge portion of the support body on which the inorganic layer is provided and separated from the edge portion.
5. The display device according to claim 1,
wherein the eaves body has a reversely tapered shape in a cross-sectional view, and
the eaves portion is provided on each of the edge portions of the eaves body along the edge portion of the support body in a plan view.
6. The display device according to claim 1,
wherein the eaves body includes the eaves portion, in a plan view, on only an edge portion closer to the display region, of the edge portions of the eaves body along the edge portion of the support body.
7. The display device according to claim 1,
wherein the sealing film includes a first inorganic layer, a second inorganic layer, and an organic layer sealed between the first inorganic layer and the second inorganic layer and covering the display region, and the eaves body is provided outside an edge portion of the organic layer in a plan view.

8. The display device according to claim 1, wherein the support body has a quadrilateral shape in a plan view, a terminal portion is provided between at least part of a side of four sides of the support body and the display region, along the at least one side, and the eaves body faces at least an edge portion of the support body located on a side on which the terminal portion is not provided.

9. The display device according to claim 8, wherein the eaves body is further provided between the display region and the terminal portion in a plan view.

10. A display device comprising:

a support body;

a plurality of light emitting elements provided on the support body; and a sealing film configured to seal the plurality of light emitting elements, wherein the sealing film includes at least an inorganic layer, the inorganic layer covers at least part of an edge portion of the support bod in a plan view, an eaves body including an eaves portion is provided outside a display region of the support body in which the plurality of light emitting elements are disposed and provided along the edge portion on which the inorganic layer is provided in a plan view, the eaves portion is provided protruding above the support body in a cross-sectional view, on at least one of edge portions of the eaves body along the edge portion of the support body, the inorganic layer covers the eaves portion and is split a below the eaves portion facing wall surface of the eaves body, the eaves body is provided on at least part of the edge portion of the support body with an end face of the support body and one end face of the eaves body, along the at least part of the edge portion, flush with each other, and the eaves portion is provided only on an edge portion closer to the display region located inside the edge portion of the support body, of the edge portions of the eaves body along the edge portion of the support body in a plan view.

11. The display device according to claim 1, wherein the eaves body has a height at least twice a height of the inorganic layer on the eaves body.

12. The display device according to claim 1, wherein the eaves body has a height of at least 1 μm.

13. The display device according to claim 1, wherein the eaves body has a height of at least 4 μm.

14. The display device according to claim 1, wherein the eaves body has a width at least 1.5 times the height of the eaves body.

15. A display device comprising:

a support body;

a plurality of light emitting elements provided on the support body; and a sealing film configured to seal the plurality of light emitting elements, wherein the sealing film includes at least an inorganic layer, the inorganic layer covers at least part of an edge portion of the support body in a plan view, an eaves body including an eaves portion is provided outside a display region of the support body in which the plurality of light emitting elements are disposed and provided along the edge portion on which the inorganic layer is provided in a plan view, the eaves portion is provided protruding above the support body in a cross-sectional view, on at least one of edge portions of the eaves body along the edge portion of the support body, the inorganic layer covers the eaves portion and is split apart below the eaves portion facing a wall surface of the eaves body, the support body has a quadrilateral shape in a plan view, a terminal portion is provided between at least part of a side of four sides of the support body and the display region, along the at least one side, and the eaves body faces at least an edge portion of the support body located on a side on which the terminal portion is not provided.

* * * * *